(12) United States Patent
Chirovsky et al.

(10) Patent No.: US 6,750,071 B2
(45) Date of Patent: Jun. 15, 2004

(54) METHOD OF SELF-ALIGNING AN OXIDE APERTURE WITH AN ANNULAR INTRA-CAVITY CONTACT IN A LONG WAVELENGTH VCSEL

(75) Inventors: Leo M. F. Chirovsky, Superior, CO (US); Ryan Likeke Naone, Boulder, CO (US); David Kisker, Longmont, CO (US); Stewart Feld, Westminster, CO (US)

(73) Assignee: Optical Communication Products, Inc., Woodland Hills, CA (US)

( * ) Notice: Subject to any disclaimer, the term of this patent is extended or adjusted under 35 U.S.C. 154(b) by 0 days.

(21) Appl. No.: 10/613,652

(22) Filed: Jul. 3, 2003

(65) Prior Publication Data

US 2004/0058467 A1 Mar. 25, 2004

Related U.S. Application Data

(60) Provisional application No. 60/394,035, filed on Jul. 6, 2002.

(51) Int. Cl.[7] .............................................. H01L 21/00
(52) U.S. Cl. .............................................. 438/22; 39/42
(58) Field of Search ................ 438/22–47, 700–706, 438/7, 584, 604, 6

(56) References Cited

U.S. PATENT DOCUMENTS

| | | | | |
|---|---|---|---|---|
| 5,985,683 A | * | 11/1999 | Jewell | 438/22 |
| 5,991,326 A | * | 11/1999 | Yuen et al. | 372/96 |
| 6,075,804 A | * | 6/2000 | Deppe et al. | 372/96 |
| 6,169,756 B1 | * | 1/2001 | Chirovsky et al. | 372/46 |
| 6,411,638 B1 | * | 6/2002 | Johnson et al. | 372/46 |
| 6,618,414 B1 | * | 9/2003 | Wasserbauer et al. | 372/45 |
| 2002/0090016 A1 | * | 7/2002 | Coldren et al. | 372/96 |
| 2002/0101894 A1 | * | 8/2002 | Coldren et al. | 372/43 |
| 2002/0131462 A1 | * | 9/2002 | Lin et al. | 372/43 |
| 2002/0150135 A1 | * | 10/2002 | Naone et al. | 372/45 |
| 2003/0031221 A1 | * | 2/2003 | Wang et al. | 372/45 |
| 2003/0185267 A1 | * | 10/2003 | Hwang et al. | 372/96 |

* cited by examiner

Primary Examiner—Savitri Mulpuri
(74) Attorney, Agent, or Firm—Barlow, Josephs & Holmes, Ltd.

(57) ABSTRACT

A method of forming a vertical cavity surface emitting laser (100, 600, 900) includes process steps for self-aligning the p-type ohmic contact (118, 518, 932), an oxide current aperture (122, 926a), and a central puck of re-phase material (560a, 936) around the optical axis of the laser.

10 Claims, 26 Drawing Sheets

METHOD OF SELF-ALIGNING AN OXIDE APERTURE WITH AN ANNULAR INTRA-CAVITY CONTACT IN A LONG WAVELENGTH VCSEL

This application claims the benefit of U.S. Provisional Patent Application No. 60/394,035 filed Jul. 6, 2002.

FIELD OF THE INVENTION

This invention generally relates to optoelectronic transmitters as used in optical communication systems, and more particularly to long wavelength vertical cavity surface emitting lasers which are used as the light source is such devices.

BACKGROUND

A VCSEL is a semiconductor laser diode in which the laser oscillation and the optical emission occur in a direction normal to the p-n junction plane. VCSELs include a semiconductor layer of optically active material, such as gallium arsenide or indium phosphide sandwiched between highly reflective mirror stacks. Conventionally, one of the mirror stacks is partially reflective so as to pass a portion of the coherent light which builds up in the resonate cavity formed by the mirror stacks sandwiching the active layer.

Lasing structures require optical confinement in the resonating cavity and carrier confinement in the active region to achieve efficient conversion of pumping electron-hole pairs into stimulated photons through population inversion. In order to reach the threshold for lasing, the total gain of a VCSEL must be equal to or greater than the total loss of the VCSEL. However, the compact nature of VCSELs typically limits the volume of gain media integrated into the device. Therefore, low-threshold, high-efficiency VCSEL operation typically requires a low loss index guiding mechanism and highly reflective low loss mirrors.

SUMMARY

In one aspect of the present invention a method of forming a VCSEL having a plurality of layers includes forming an ohmic contact adjacent an optical cavity, forming a mesa in at least a portion of the plurality of VCSEL layers in accordance with the ohmic contact to expose an oxide aperture layer and oxidizing the oxide aperture layer to form an oxide aperture that is aligned with the ohmic aperture formed by the ohmic contact.

BRIEF DESCRIPTION OF THE DRAWINGS

These and other features, aspects, and advantages of the present invention will become better understood with regard to the following description, appended claims, and accompanying drawings, in which:

FIG. 11 is a cross section of the VCSEL of FIG. 10 wherein an ohmic metalization layer has been deposited to form the intracavity contact in accordance with an exemplary embodiment of the present invention;

DETAILED DESCRIPTION OF THE INVENTION

An exemplary embodiment of the present invention provides a high speed, low loss optoelectronic transmitter. One of the factors that limits the speed of a semiconductor laser is the RC time constant of the device. The series resistance and optical loss of a conventional optoelectronic device may be limited in part by conduction through at least part of a high resistance DBR mirror.

In addition, current constrictions for transverse mode control may also limit the device series resistance. For example, ion implants are often utilized to constrict the current to a smaller diameter at the active area of the VCSEL relative to where it is injected at the contact. In practice, ion implants typically have a Gausssian like vertical distribution, damaging the layers above and below the constriction thereby increasing the overall thickness of the constriction as well as the device resistance.

Figure 1:
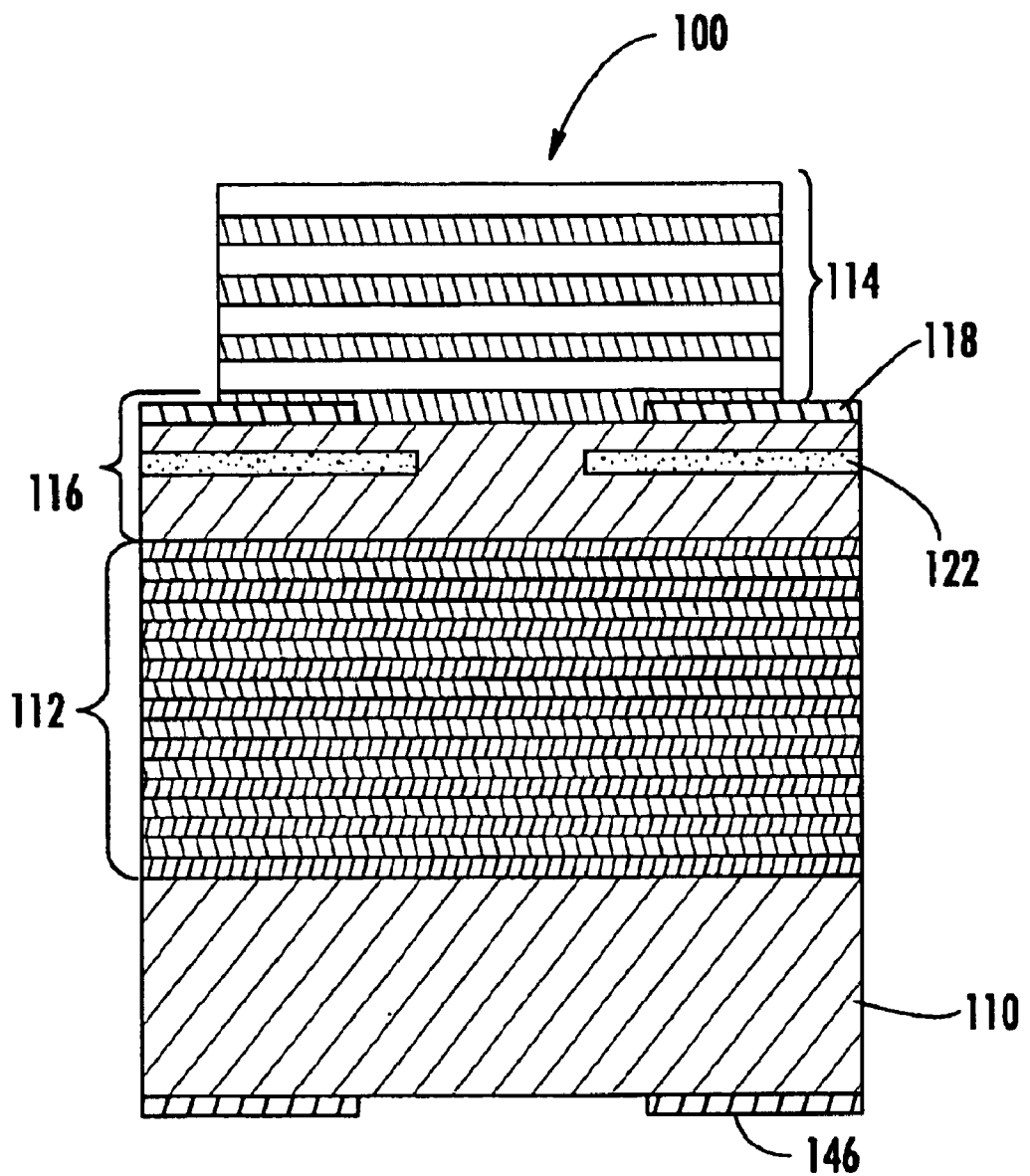
FIG. 1 is a cross-section of a VCSEL having a first mirror, an optical cavity having an active region and a second mirror and an oxide aperture current constriction in accordance with an exemplary embodiment of the present invention.

Therefore, referring to FIG. 1, an exemplary embodiment of the present invention may utilize an intracavity contact and oxide aperture to provide a high speed, low loss optoelectronic device. In the described exemplary embodiment a semiconductor light-emitting device 100 may comprise a lower mirror 112 adjacent a substrate 110, an upper mirror 114 above the lower mirror and an optical cavity 116, sandwiched between the upper and lower mirrors.

The lower mirror of the light emitting device may comprise a plurality of epitaxially grown compound semiconductor mirror periods. As is known in the art, the mirror periods may comprise, but are not limited to, one-quarter wavelength thick alternating layers of a high index of refraction material and a low index of refraction material. The lower mirror of such a device may be doped n-type with a reflectivity of at least about 99%.

Figure 2:
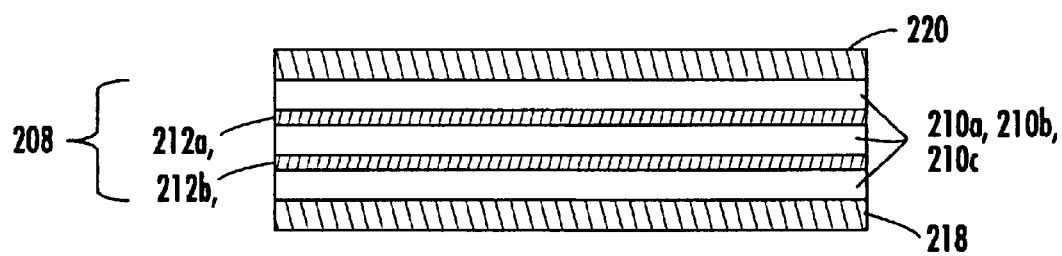
FIG. 2 is a cross-section of the optical cavity of FIG. 1, wherein the cavity includes an active region with one or more active layers in accordance with an exemplary embodiment of the present invention.

Referring briefly to FIG. 2, the optical cavity may include an active region 208 surrounded by first and second cladding regions 218 and 220. In an exemplary embodiment the active region may comprise one or more quantum wells 210(*a–c*) separated by barrier layers 212(*a–b*). The quantum-wells provide quantum confinement of electrons and holes therein to enhance recombination for the generation of the light, and may also include semiconductor layers comprising a plurality of quantum wires, quantum dots or other suitable gain material.

One of skill in the art will appreciate that the active layer(s) within the active region may be formed from a variety of material compositions. However, the proper selection of an active layer material preferably balances the gain requirements of the material with the mechanical stability of the device.

Referring back to FIG. 1, in the described exemplary embodiment an intracavity contact 118 may be formed above the optical cavity and a lower ohmic contact 146 may be formed below the optical cavity. In one embodiment the lower ohmic contact may be formed below the substrate 110 as illustrated in FIG. 1 or may be an intracavity contact to lower the resistance of the device. For example the lower ohmic contact in the various embodiments described below may have an intracavity arrangement such as those disclosed in commonly owned, copending U.S. patent application Ser. No. 10/122,707, entitled "Long Wavelength Vertical Cavity Surface Emitting Laser", filed Mar. 11, 2002, the contact of which is incorporated herein by reference as if set forth in its entirety.

In the described exemplary embodiment the lower ohmic contact 146 may be an n-type ohmic contact comprising an n-type metalization such as AuGe/Ni/Au deposited to form either a full-surface metalization on the lower surface of the substrate 110, or patterned to provide an annular aperture therethrough centered about the aperture in the optical cavity 116.

In operation, electrical current is conducted through the intra-cavity contact 118 (also referred to as an upper contact), then is laterally injected towards the aperture, and finally flows vertically through the aperture into the active region of the optical cavity 116 so that the upper mirror need not be conductive. Therefore, the upper mirror 114 may comprise a dielectric DBR formed from alternating one-quarter wavelength thick layers of a high index of refraction dielectric material and a low index of refraction dielectric material. For example, the upper mirror may comprise alternating layer of silicon nitride and silicon dioxide or other suitable dielectric materials. Advantageously, the use of the dielectric DBR may reduce the series resistance and optical loss that may otherwise be associated with a doped semiconductor upper mirror.

In the described exemplary embodiment an oxide aperture 122 is formed between the active region and the intracavity contact, and in certain embodiments functions to concentrate the current into a small area to thereby achieve the threshold current density with a smaller current. In an exemplary VCSEL structure, the oxide aperture may be formed by the steam oxidation of an Al-containing semiconductor layer. Water vapor exposure creates an oxide aperture some distance in from the sidewall toward the central vertical axis, depending on the duration of oxidation. The oxide aperture also introduces variation in the lateral refractive index and can provide a significant waveguiding effect in the transverse dimension. In alternate embodiments, the oxidized material may be etched away or otherwise removed, forming an "air gap" aperture. Backfill material may then also be used in the formation of the aperture.

In practice, current confined devices may be susceptible to current crowding around the edges of the current aperture (e.g., oxide, implant, or other). Current crowding may result if the lateral conductivity is not small enough in relation to the vertical conductivity through the aperture. The effects of current crowding may be accentuated if the center of the oxide aperture is not adequately aligned with the aperture formed by the intracavity contact.

The oxidized outer portion of the oxide aperture generally has an annular shape with the oxidation extending symmetrically inward from the etched sidewalls of a mesa. The oxide aperture is therefore centered in the mesa. A lateral offset between the center of the oxide aperture and the center of the intracavity contact will therefore be created if the intracavity contact is not centered on the upper surface of the mesa.

Figure 3:
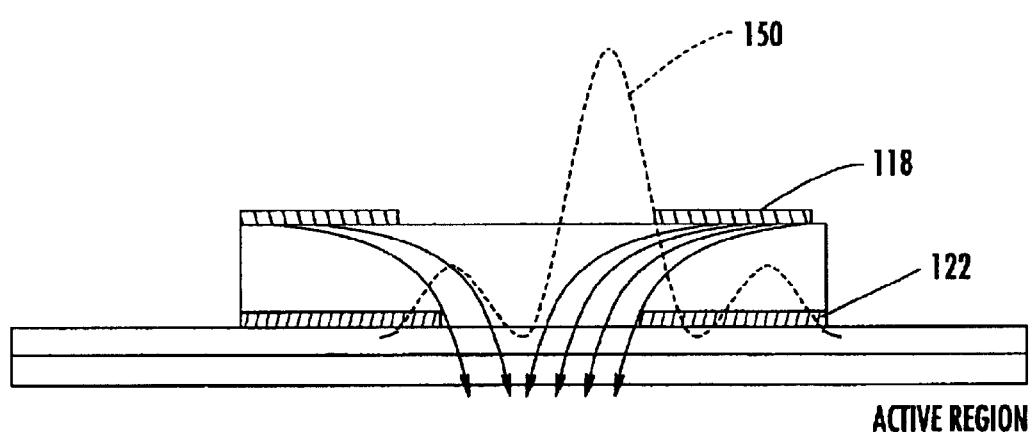
FIG. 3 is a cross-section of a portion of the VCSEL of FIG. 1 graphically illustrating the overlap with the fundamental mode when the oxide aperture current constriction and the ohmic aperture are not aligned.

Referring to FIG. 3, in practice a lateral offset between the oxide aperture 122 and the aperture formed by the intracavity contact 118 may create asymmetric resistance paths between the intracavity contact and the active region. The injected current will therefore tend to asymmetrically crowd along the paths of least resistance resulting in asymmetric pumping of the active region. In addition, the fundamental mode of the emitted optical beam 150 tends to center itself about the highest injected current resulting in an offset between the center of the emitted beam and the center of the aperture formed by the intracavity contact. In operation, the intracavity contact may therefore clip the emitted beam increasing the optical loss of the device.

Therefore, in the described exemplary embodiment the annular intracavity contact 118 may be formed on an upper surface of the optical cavity prior to the formation of the mesa and patterned for use as an etch mask for the formation of the mesa. Advantageously, the use of the annular intracavity contact to define the outer wall of the mesa automatically aligns the center of the ohmic aperture with the center of the oxide aperture.

Figure 4:
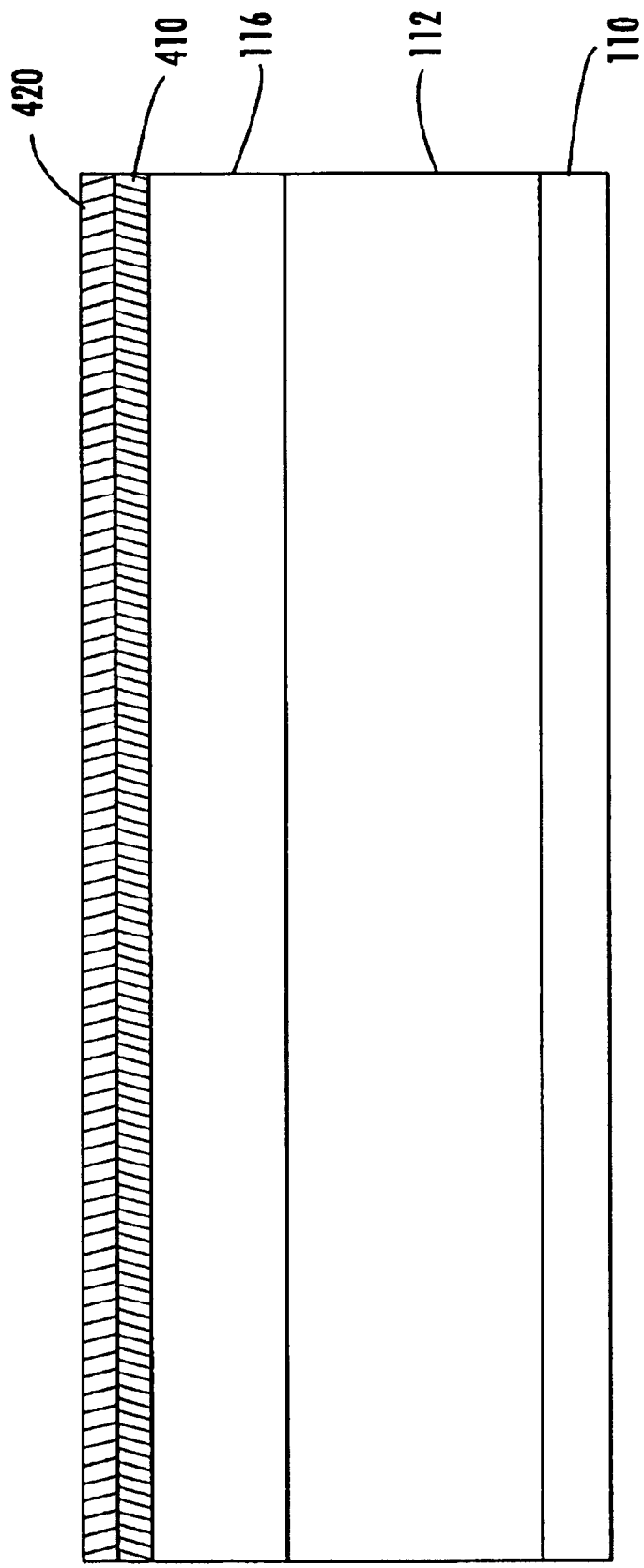
FIG. 4 is a simplified cross-section of the VCSEL of FIG. 1 wherein a two layer photoresist is deposited above the optical cavity in accordance with an exemplary embodiment of the present invention.
Figure 5:
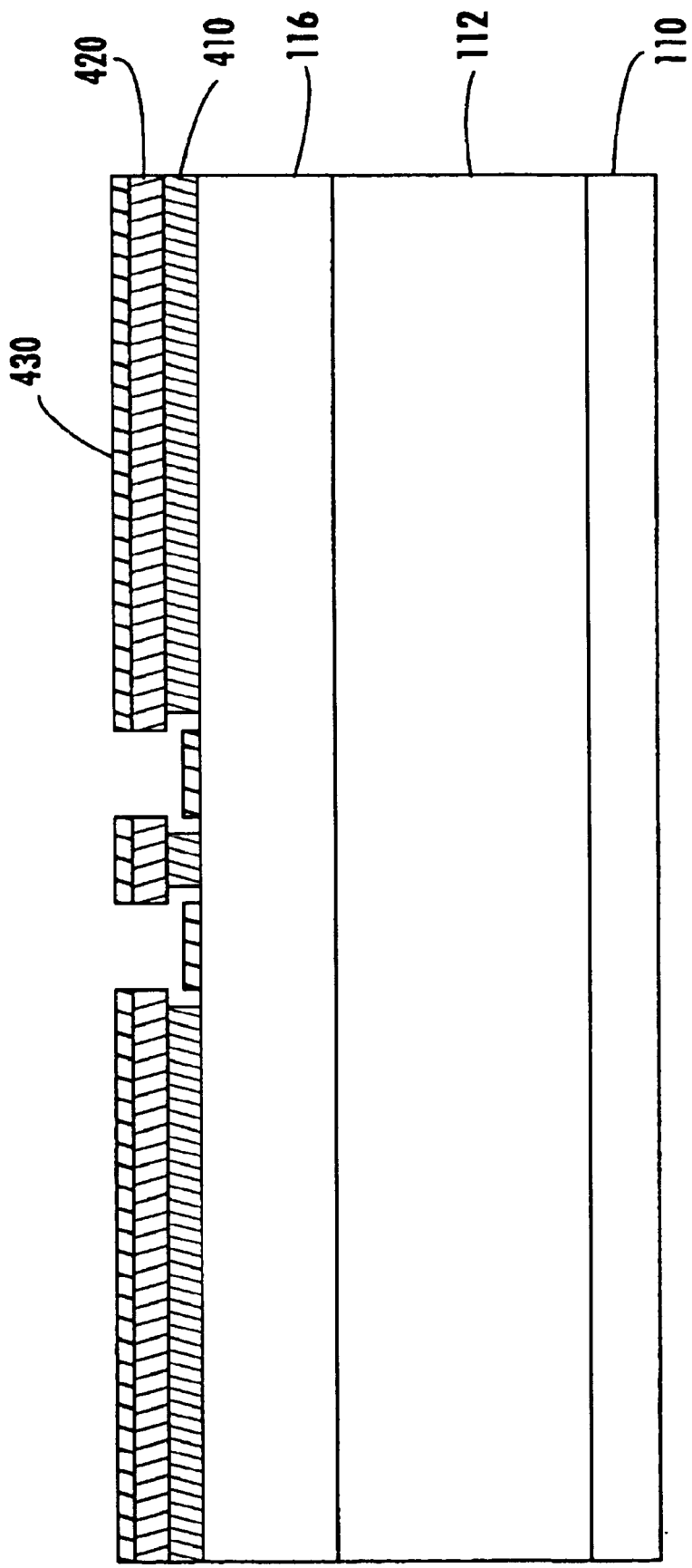
FIG. 5 is a cross-section of the VCSEL of FIG. 4 wherein the two layer photoresist has been patterned and a ohmic metalization layer has been deposited adjacent the optical cavity to form an intracavity contact in accordance with an exemplary embodiment of the present invention.

For example, referring to the cross section of FIG. 4 in an exemplary process for producing VCSELs the intracavity contact may be formed from a lithographic masking and lift-off process. In the described exemplary embodiment a multi-layer photoresist 410 and 420 may be deposited across the upper surface of the optical cavity 116. As will be appreciated by those skilled in the art, a single-layer photoresist may also be used. Referring to FIG. 5 the photoresist may be patterned and etched prior to the deposition of the intracavity contact metalization 430.

Figure 6:
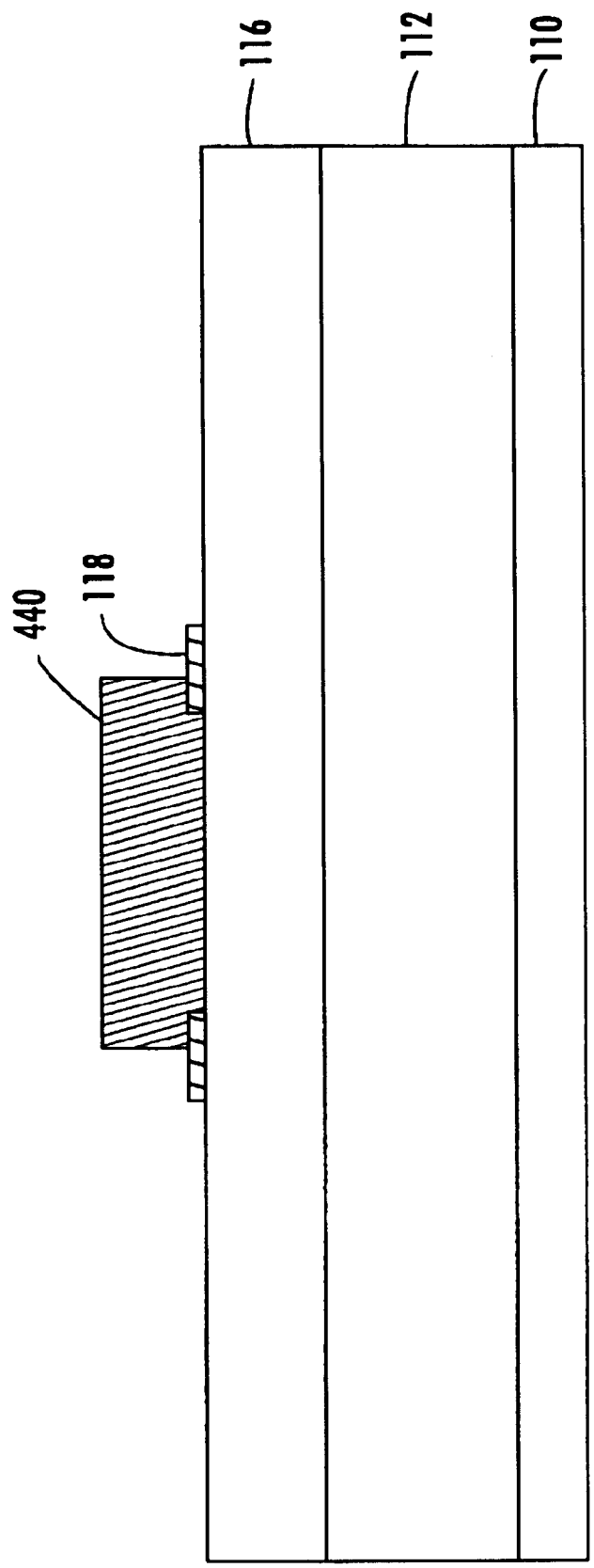
FIG. 6 is a cross-section of the VCSEL of FIG. 5 wherein a single layer photoresist is deposited above a portion of the intracavity contact and ohmic aperture in accordance with an exemplary embodiment of the present invention.

In one embodiment the intracavity contact may be a p-type ohmic contact and may be formed by depositing a p-type metalization layer 430, above the optical cavity. The intra-cavity contact may be deposited by electron beam evaporation or other techniques known in the art. In accordance with an exemplary embodiment, the multi-layer photoresist may be removed and a single step photoresist 440 may be formed by photolithography as illustrated in FIG. 6. In the described exemplary embodiment, the single layer photoresist 440 overlaps onto a portion of the intracavity contact leaving the outer edge of the annular intracavity contact 118 exposed.

Figure 7:
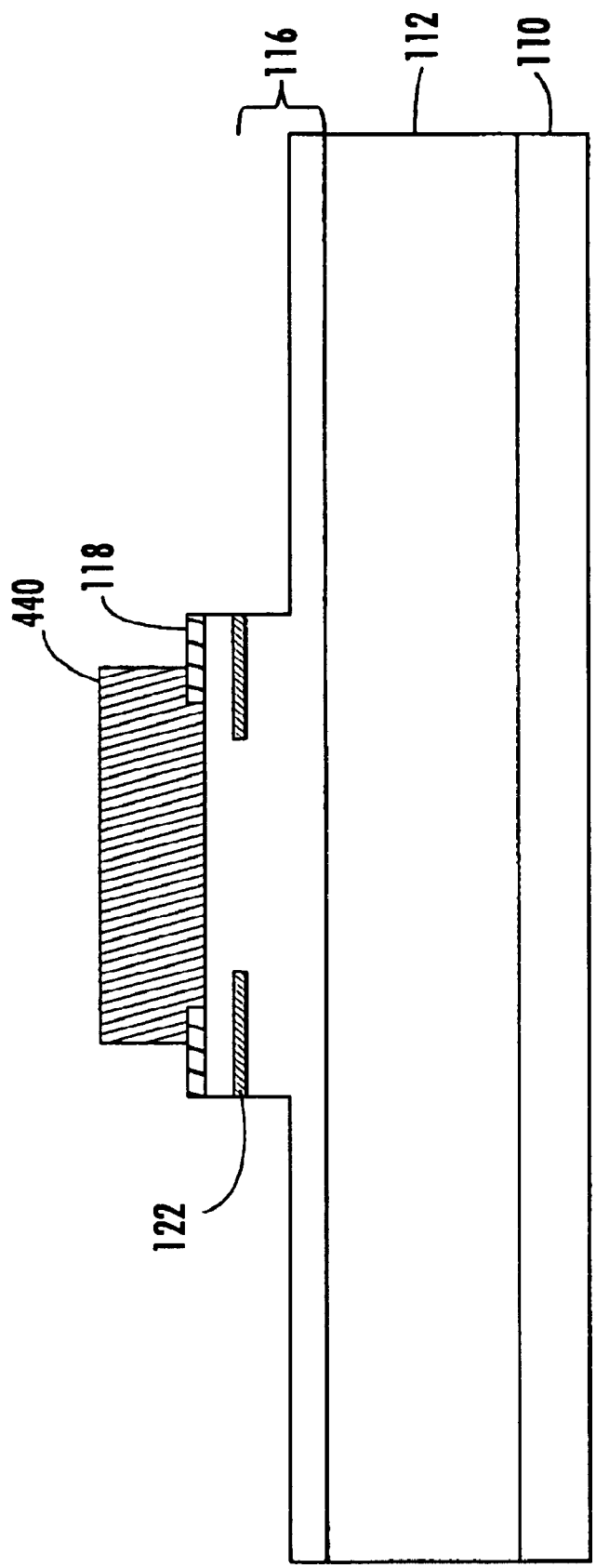
FIG. 7 is a cross-section of the VCSEL of FIG. 6 wherein the intracavity contact is used as an etch mask to define the outer walls of a mesa that exposes an oxide aperture layer in accordance with an exemplary embodiment of the present invention.

Referring to FIG. 7, a portion of the semiconductor layers at least down to the oxide aperture 122 may now be etched using the intracavity contact 118 as an etch mask to define the outer wall of the mesa. In an exemplary embodiment, a high density plasma etch system, such as, for example an inductively coupled plasma etch or the like may be used to form the mesa to reduce the etch time and minimize contact erosion. The described exemplary intracavity contact may be formed from a material composition that resists erosion during the plasma etch process.

For example, an exemplary intracavity contact 118 may comprise a layered structure, such as titanium and platinum or titanium, platinum and gold. In accordance with an exemplary embodiment, a reactive layer such as titanium may be utilized to couple with the semiconductor layers of the optical cavity and an inert layer, such as platinum may be deposited over the reactive layer to resist erosion during the mesa etch. In accordance with an exemplary embodiment the platinum may be in the range of about 1000–2000 angstroms thick and the titanium may be in the range of about 250–1000 angstroms thick. However, one of skill in the art will appreciate that the composition of the intracavity contact may vary as a function of the semiconductor material upon which it is deposited.

In the described exemplary embodiment the oxide aperture 122 may now be formed by placing the wafer into a container and heating the wafer to a temperature of about 350 to 500° C. under a controlled environment having a high humidity. Such a moist environment may be generated, for example, by flowing a gas, such as nitrogen, through water heated to about 80–95° C. to entrain water vapor, and then directing the moisture-laden gas into the container.

The described exemplary intracavity contact may therefore also be resistant to oxidation which may occur during the formation of the oxide aperture. Otherwise a protective coating may be deposited over the intracavity contact to prevent oxidation of the contact during the formation of the oxide aperture. In the described exemplary embodiment of FIG. 1, the upper mirror 114 may be formed adjacent the optical cavity 116 and the intra-cavity contact 118.

Figure 8:
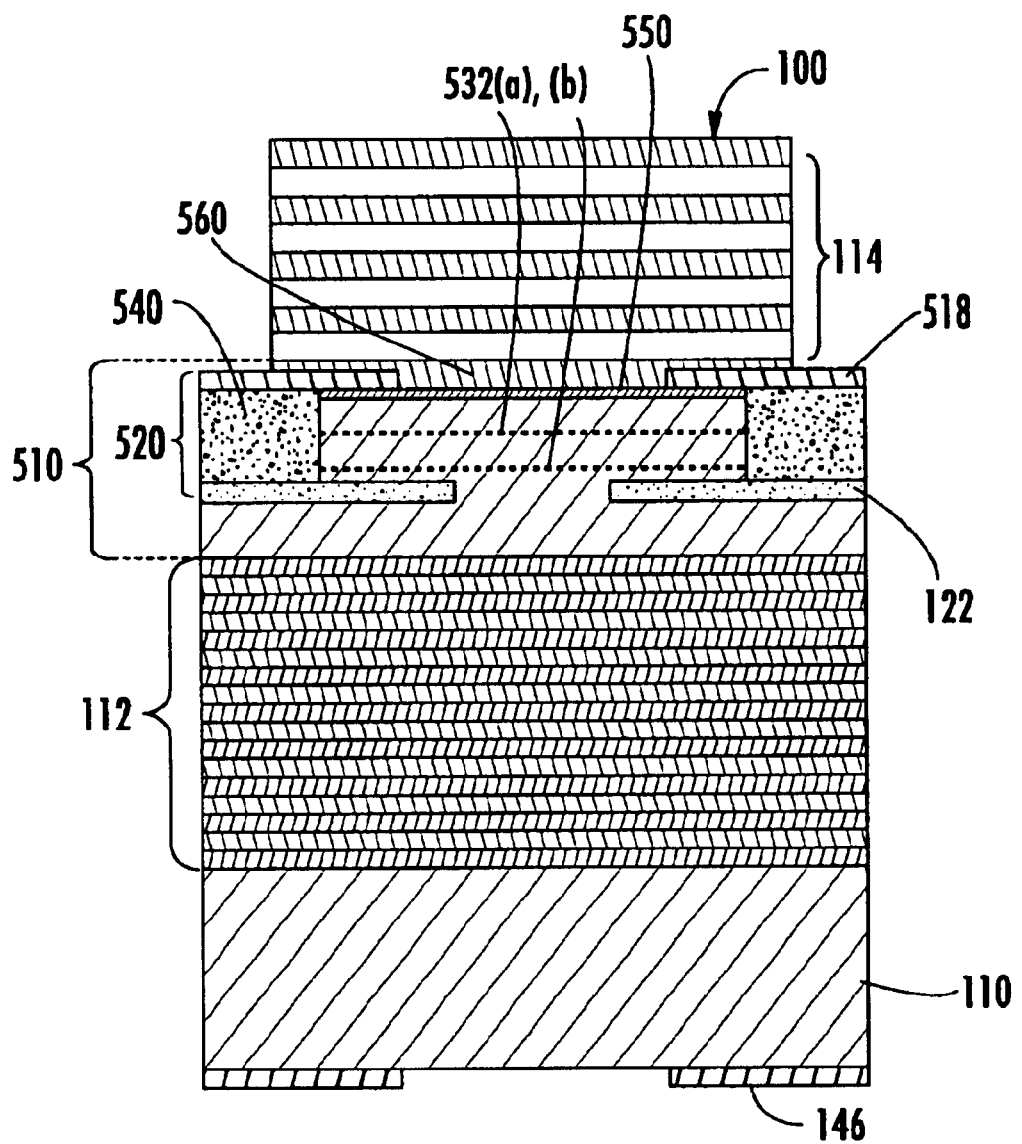
FIG. 8 is a cross-section of a VCSEL having an intracavity contact formed adjacent a current spreading layer above a delta doped upper cladding and a dielectric spacer layer adjacent the intracavity contact and current spreading layer in accordance with an exemplary embodiment of the present invention.

Referring to FIG. 8, in another embodiment of the present invention an optical cavity may 510 include a delta doped upper cladding 520 for conducting holes into the active region to cause lasing as disclosed in commonly owned, copending U.S. patent application Ser. No. 10/105,473 entitled "HYBRID VCSEL WITH BURIED INTERFACE", filed Mar. 25, 2002, the content of which is incorporated herein by reference as if set forth in its entirety.

The delta doped upper cladding 520 may be bulk doped with a suitable p-type dopant, such as, for example, C or Be at a relatively low density. In one embodiment, the delta doped upper cladding layer 520 may include one or more p-type doping spikes 532(*a*) and 532(*b*) located at or near nulls in the optical standing wave pattern.

Advantageously, the placement of the p-type doping spikes, at or near nulls in the standing wave intensity pattern where the optical losses are near zero, provides lateral conduction from the intra-cavity contact with relatively low resistance. One of skill in the art will appreciate that the p-type doping spikes in the delta doped upper cladding may not be necessary in some designs where device resistance is not a limiting constraint, although it is nevertheless likely that current crowding will occur symmetrically at the edges of the aperture if the doping spikes are absent.

In the described exemplary embodiment, the bulk doped p-type material of the delta doped upper cladding 130 has a relatively low dopant concentration. The delta doped upper cladding may not therefore have sufficient conductivity to provide a low resistance intra-cavity contact 118. Therefore, in one embodiment, a contact layer 550 may be deposited on the uppermost surface of the delta doped upper cladding 520. In the described exemplary embodiment the contact layer is highly conductive, with a p-type doping density greater than about $1 \times 10^{19}$ cm$^{-3}$. The intra-cavity contact 118 may then be deposited on the more heavily doped contact layer 550. In accordance with an exemplary embodiment, the contact layer 550, in combination with p-type doping spikes 532(*a*) and 532(*b*), may also act as a current spreading layer to provide a more uniform current distribution across the ohmic aperture, improving current injection into the active region of the optical cavity.

In a conventional structure a low index of refraction dielectric layer would be formed proximate the p-type contact layer and the mirror terminates in a high index layer. In operation, the large step down in the index of refraction at the interface between the uppermost high index of refraction layer and free space creates a maximum in the optical standing wave at this interface. In addition, the alternating layers are typically stacked such that the maxima in the optical standing wave intensity are located at the high-to-low index steps as seen from the optical cavity.

Therefore, conventional structures also result in the formation of a maximum of the optical standing wave intensity pattern at the interface between the contact layer 550 and the dielectric upper mirror 114. Therefore, losses from the highly doped contact layer and light scattering defects, such as for example non-smooth surfaces, are magnified in a conventional design.

In an exemplary embodiment of the present invention, a dielectric spacer layer 560 may therefore be formed adjacent to the contact layer 550. In the described exemplary embodiment the dielectric upper mirror 114 may be formed above the dielectric spacer layer 560.

The integration of the dielectric spacer layer 560 adjacent the contact layer 550 functions to form a hybrid cavity. In accordance with an exemplary embodiment the undesirable interface between the contact layer 550 and the first dielectric layer is relocated to be at or near a null in the standing wave intensity pattern. Therefore, in operation the optical wave has reduced interaction with the imperfections on the surface of the semiconductor material and experiences lower loss from the highly doped contact layer 550 formed thereon.

Advantageously, the dielectric spacer layer 560 may also be utilized to form a beam guide as disclosed in commonly owned co-pending U.S. patent application Ser. No. 10/186,779, filed Jul. 1, 2002, entitled "ANTIGUIDE SINGLE MODE VERTICAL CAVITY LASER" the content of which is incorporated herein by reference as if set forth in full. Index modulation techniques generally tailor the real part of the refractive index laterally so as to form a waveguide that concentrates the beam, leading to higher efficiency, lower threshold and a greater tendency for multimode operation. The waveguide in the index modulation techniques typically involves a region of higher index of refraction and a region of lower index of refraction. The relative index step determines the radius of the waveguide for single mode operation as follows:

$$r = \frac{2.405\lambda}{2\pi\sqrt{n_1^2 - n_2^2}}, \quad \text{(Eq. 1)}$$

where $\lambda$ is the lasing wavelength and $n_1$ and $n_2$ are the effective (or weighted average) indexes of refraction along the entire length of the cavity inside and outside the radius of the optical aperture, respectively. As seen from the equation the greater the index step between the effective indices of refraction, the smaller the single mode cutoff radius.

Conventional oxide apertures typically create a relative high index step and therefore require relatively small electrical and optical apertures to achieve single mode operation. Referring to FIG. 8, in an exemplary embodiment of the present invention the thickness of the oxide aperture may be reduced and its position adjusted to be at or near a null in the standing wave, so as to reduce the index step seen by the optical mode. The described exemplary dielectric spacer layer 560 may then be utilized to form a second index guide with a different radius than the oxide aperture. Advantageously, the reduced index step due to the oxide aperture allows for the utilization of a larger diameter oxide aperture while maintaining single-mode operation. The larger aperture lowers the overall electrical resistance of the device. The second index step, at a larger radius formed in the spacer layer 560, can then concentrate the light and still maintain single-mode operation.

Figure 9:
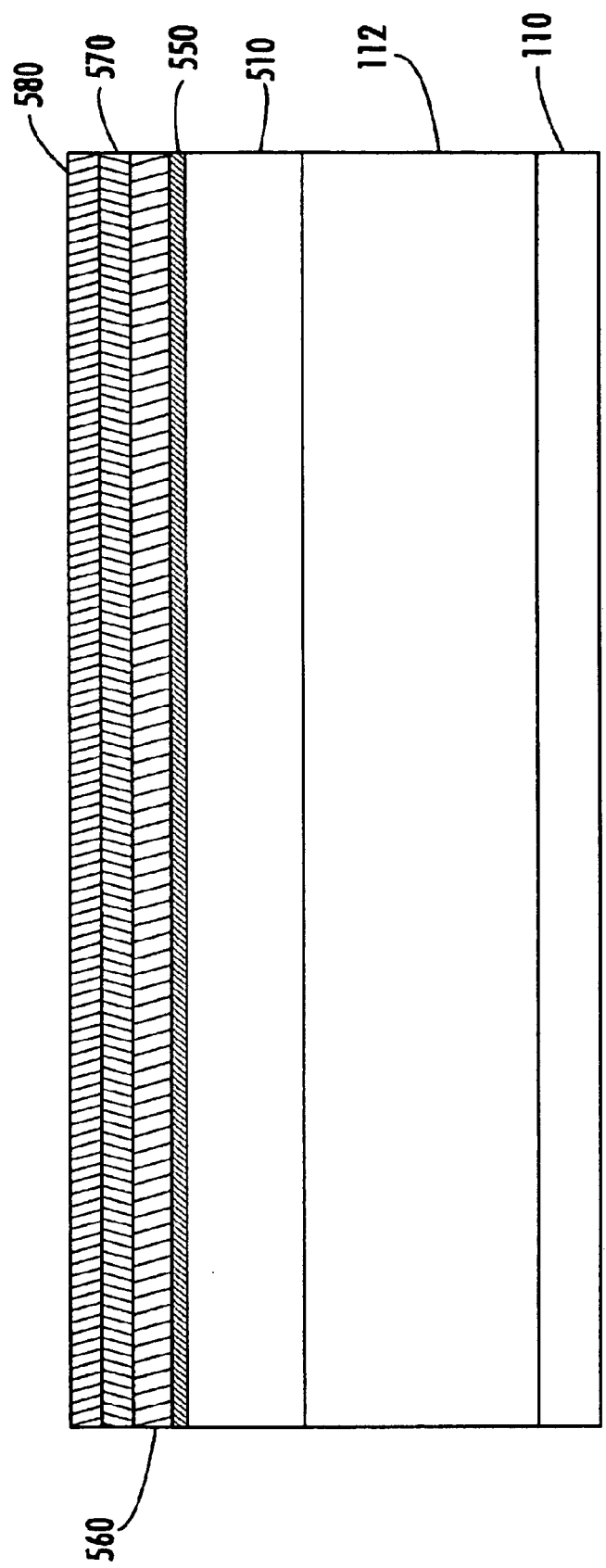
FIG. 9 is a simplified cross section of the VCSEL of FIG. 8 having a two step photoresist formed adjacent the dielectric spacer layer in accordance with an exemplary embodiment of the present invention.
Figure 10:
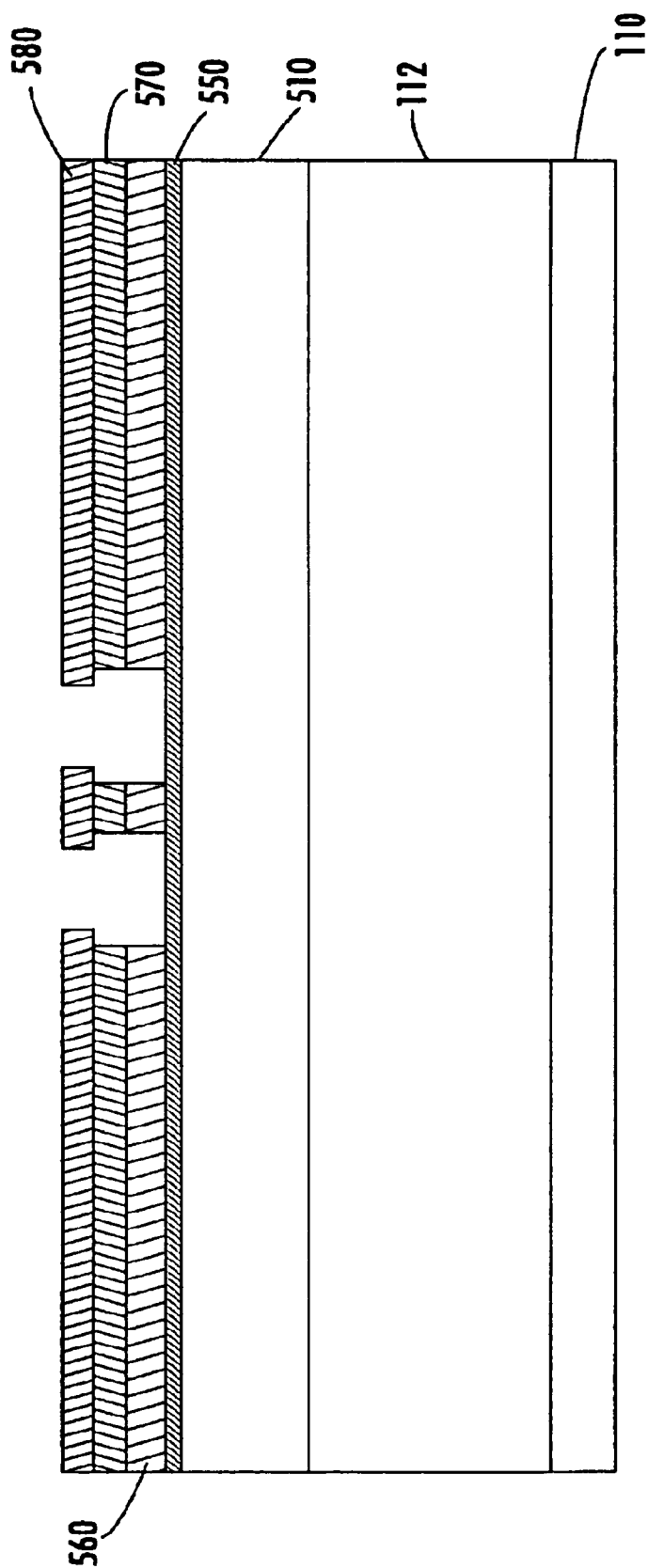
FIG. 10 is a cross section of the VCSEL of FIG. 9 wherein the two step photoresist has been patterned and vias have been formed in the dielectric spacer layer to allow for the formation of an intracavity contact adjacent the current spreading layer in accordance with an exemplary embodiment of the present invention.

The feature formed in the spacer layer 560 may also be simultaneously laterally aligned with the intracavity contact and the oxide aperture. For example, referring to FIG. 9, the contact layer 550 and dielectric spacer layer 560 may first be formed above the compound semiconductor optical cavity 510. In the described exemplary embodiment a multi-layer photoresist 570 and 580 may be deposited adjacent the dielectric spacer layer 560. Referring to FIG. 10, the photoresist may be patterned and etched prior to the deposition of the intracavity contact metalization 590 (FIG. 11). In the described exemplary embodiment, the first layer 570 of the multi-layer photoresist and the dielectric spacer layer 560 may be undercut i.e. laterally etched to a greater extent than the second layer 580 of the multi-layer photoresist.

The intracavity contact metalization 590 may now be deposited as illustrated in FIG. 11. In the described exemplary embodiment the via in the second layer 580 of the multi-layer photoresist defines the intracavity contact 518. The intracavity contact 518 may again comprise a layered structure, such as, titanium and platinum wherein the titanium provides good electrical coupling with the semiconductor layers and the platinum resists erosion during the mesa etch. In the described exemplary embodiment, the intracavity contact 518 and the dielectric spacer layer 560(*a*) within the intracavity contact aperture are defined by the same photoresist mask 580(*a*) and are therefore automatically aligned.

Figure 12:
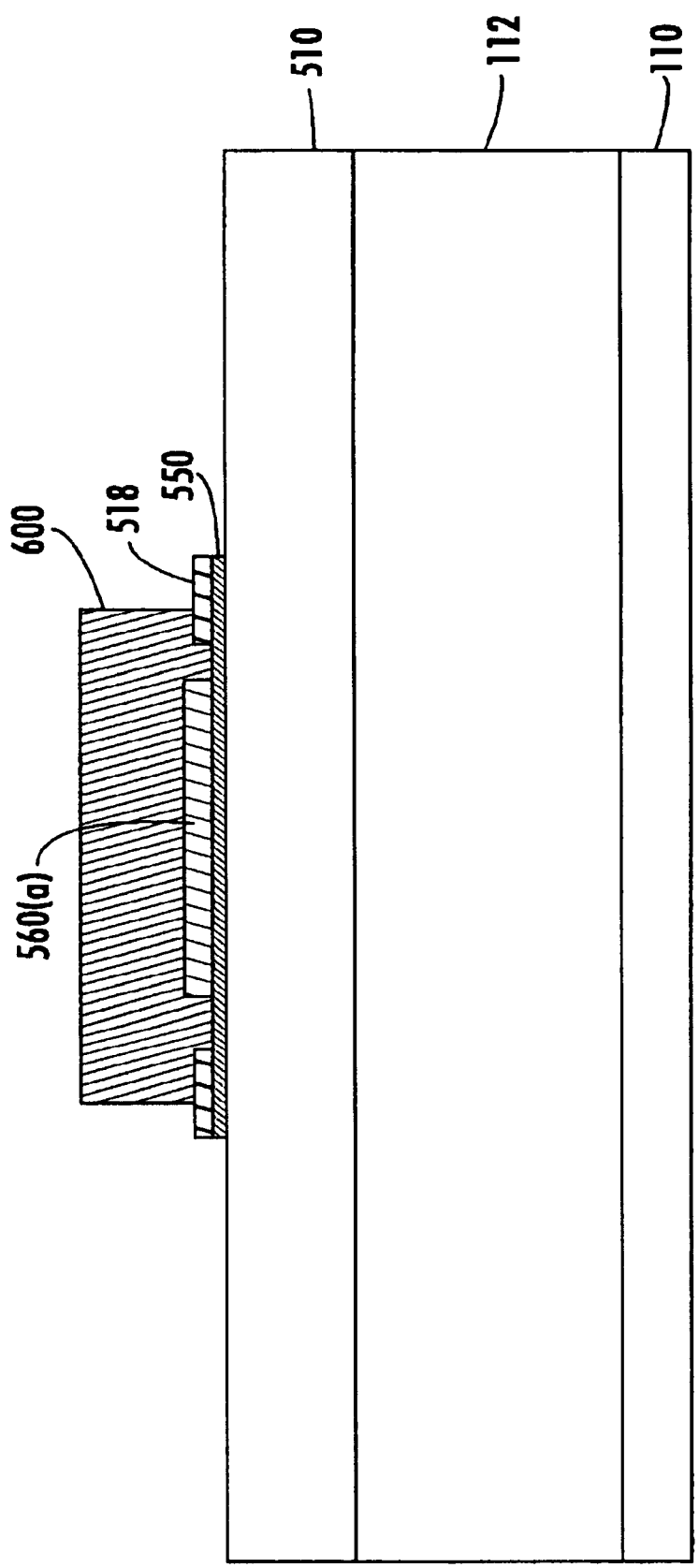
FIG. 12 is a cross-section of the VCSEL of FIG. 11 wherein a single layer photoresist is deposited above a portion of the intracavity contact and ohmic aperture in accordance with an exemplary embodiment of the present invention.

In accordance with an exemplary embodiment, the multi-layer photoresist may be removed and a single step photoresist 600 may be formed by a lithographic masking and lift off process as illustrated in FIG. 12. In the described exemplary embodiment, the single layer photoresist 600 overlaps onto a portion of the intracavity contact 518 leaving the outer edge of the annular intracavity contact 518 exposed.

Figure 13:
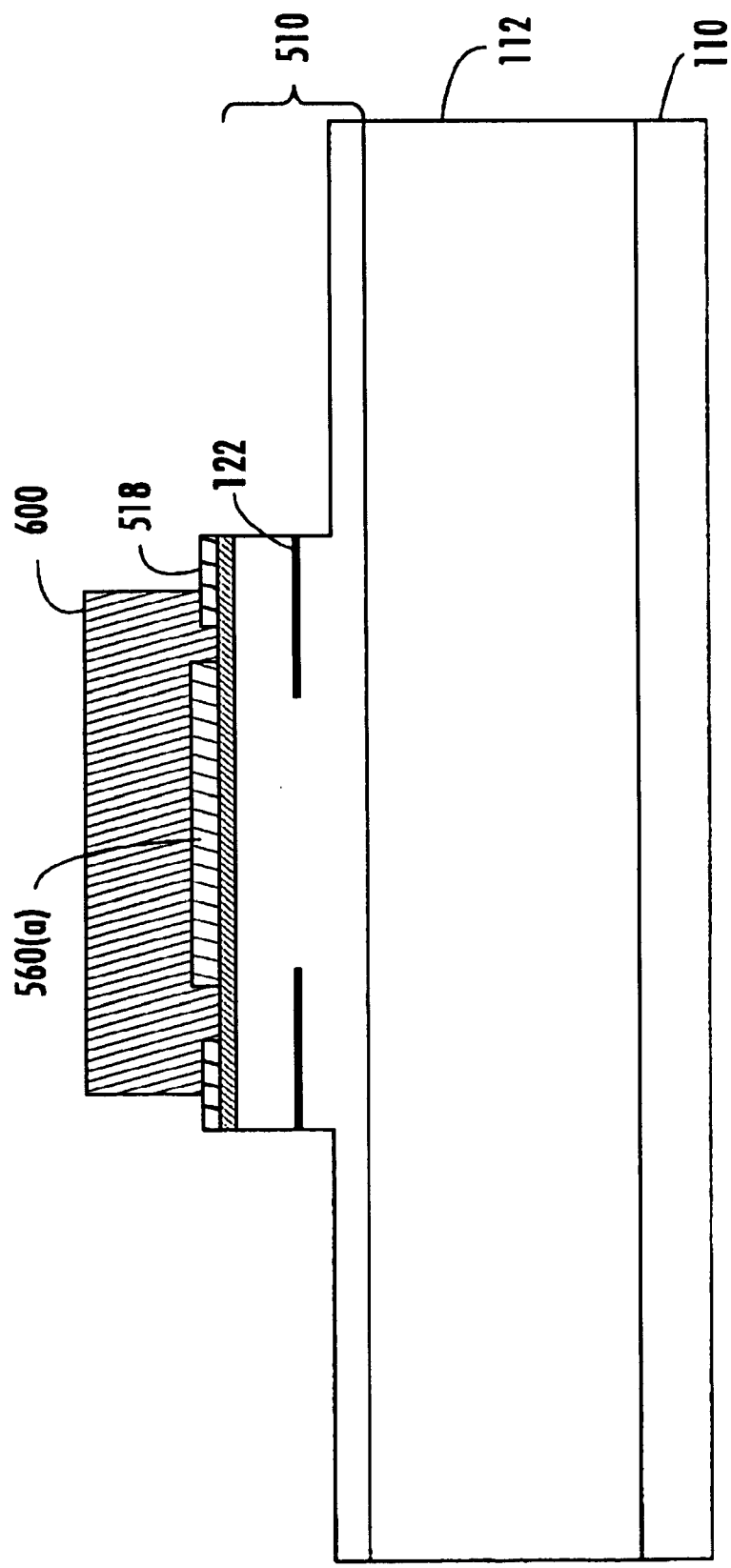
FIG. 13 is a cross-section of the VCSEL of FIG. 12 wherein the intracavity contact is used as an etch mask to define the outer walls of a mesa that exposes an oxide aperture layer in accordance with an exemplary embodiment of the present invention.

Referring to FIG. 13, a portion of the semiconductor layers at least down to the oxide aperture 122 may now be etched using the intracavity contact as an etch mask to define the outer wall of the mesa. In an exemplary embodiment a high density plasma etch system, such as, for example an inductively coupled plasma etch or the like may be used to form the mesa to reduce the etch time and minimize contact erosion.

In an exemplary embodiment the oxide aperture 122 may again be formed by placing the wafer into a container and heating the wafer to a temperature of about 350 to 500° C. under a controlled environment having a high humidity. The resulting aperture, the ohmic contact and the feature in layer 560 are automatically aligned. In the described exemplary embodiment the upper dielectric mirror 114 may be formed adjacent the dielectric spacer layer 560, the contact layer 550, and the intra-cavity contact 518.

One of skill in the art will appreciate that the present invention is not limited to particular material systems or emission wavelengths. Rather, the compound semiconductor layers of the described exemplary light-emitting device may be formed from a variety of group III–V or II–VI compound semiconductors, such as, for example, GaAs/AlGaAs, InGaAs/AlGaAs or InP/InGaAsP or other direct bandgap semiconductor materials.

Figure 14:
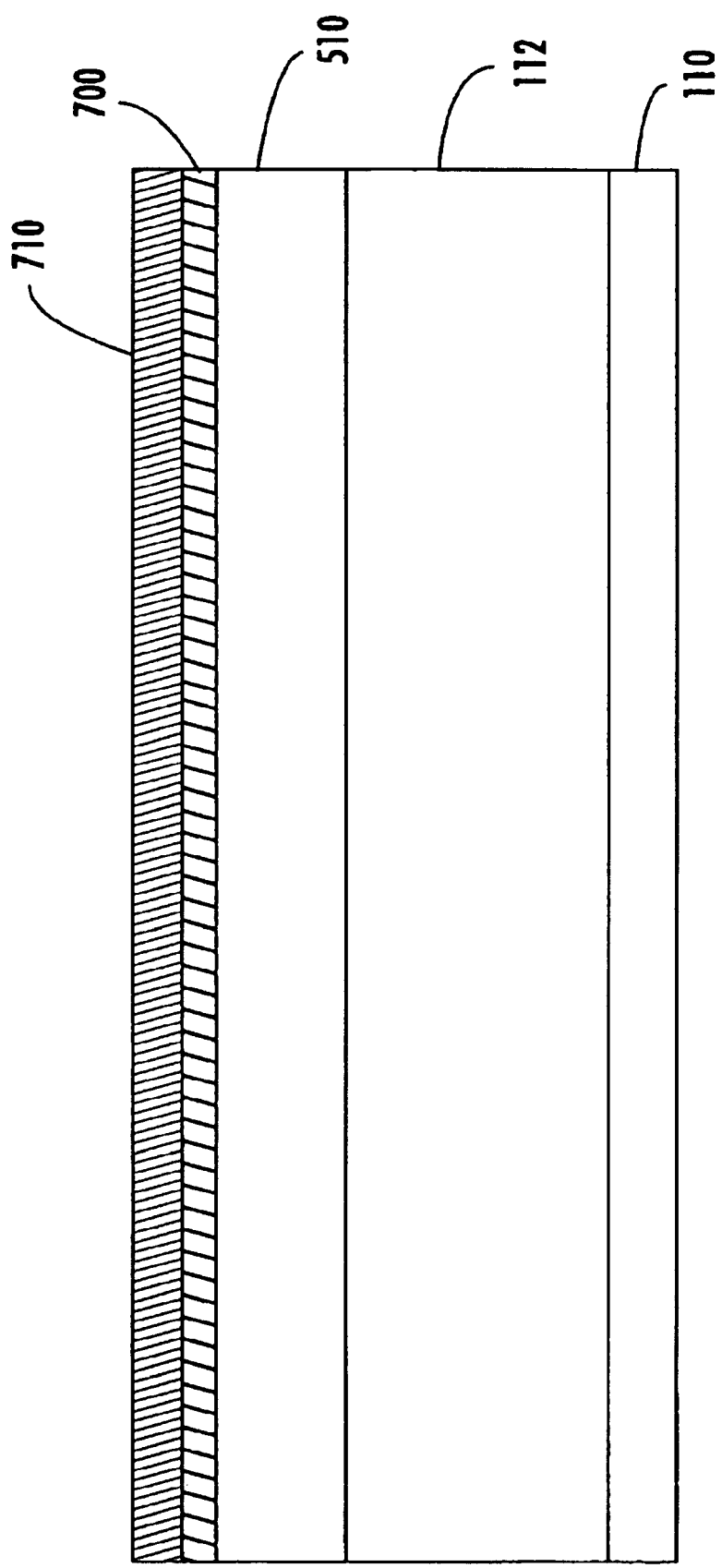
FIG. 14 is a simplified cross-section of VCSEL having an ohmic metalization layer formed adjacent an optical cavity in accordance with an exemplary embodiment of the present invention.
Figure 15:
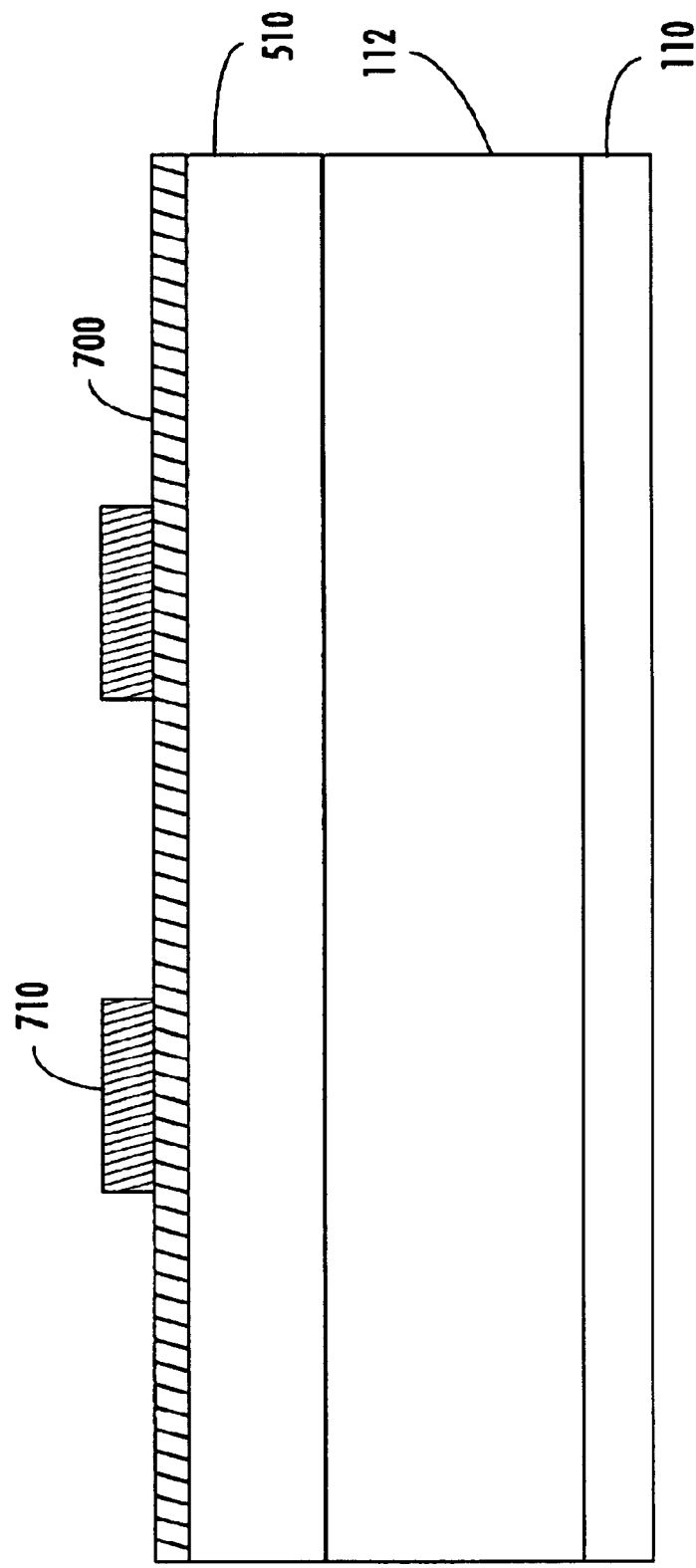
FIG. 15 is a simplified cross-section of the VCSEL of FIG. 14 wherein a photoresist layers has been deposited and patterned adjacent the ohmic metalization layer in accordance with an exemplary embodiment of the present invention.
Figure 16:
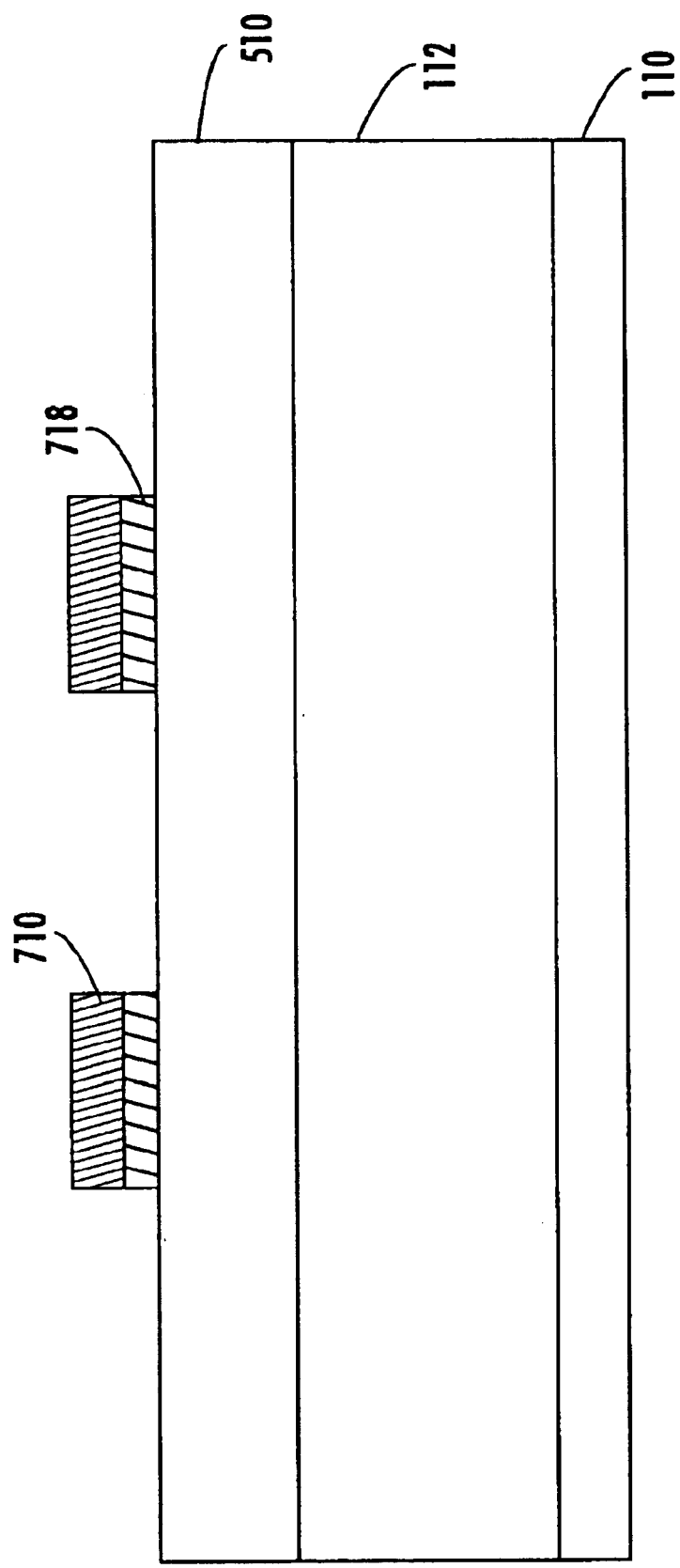
FIG. 16 is a cross-section of the VCSEL of FIG. 15 wherein the ohmic metalization layer has been processed to define an intracavity contact in accordance with an exemplary embodiment of the present invention.
Figure 17:
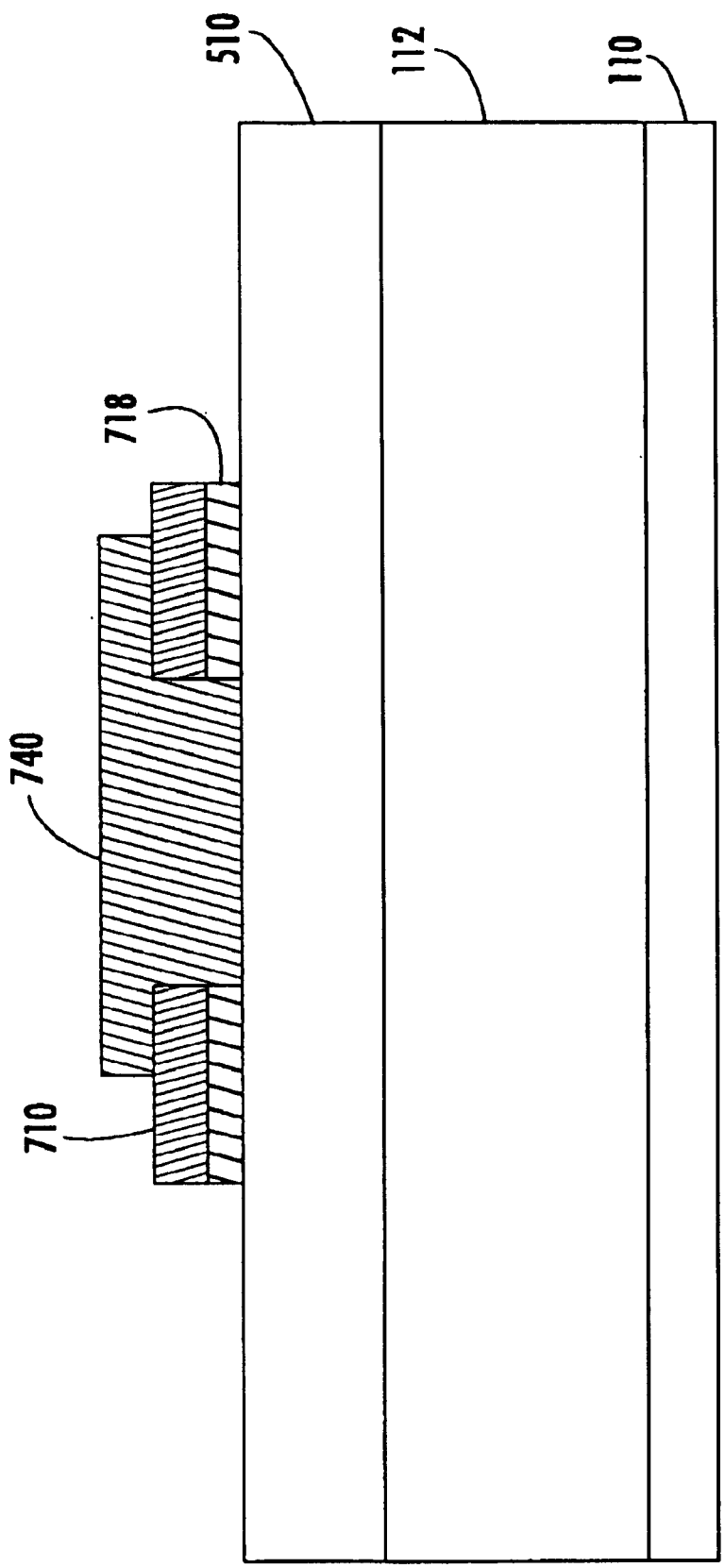

In addition, the present invention is not limited to photolithographic and lift off processes for the deposition of the described exemplary intracavity contact. Rather, the intracavity contact may be formed in accordance with a subtractive etch process. For example, referring to FIG. 14, an intracavity contact metalization layer 700 may be formed adjacent the optical cavity 510. A photoresist 710 may then be deposited above the intracavity contact metalization layer 700. The photoresist 710 may then be patterned as illustrated in FIG. 15 and the intracavity contact metalization layer may be etched to define the intracavity contact 718 as illustrated in FIG. 16.

Figure 17:
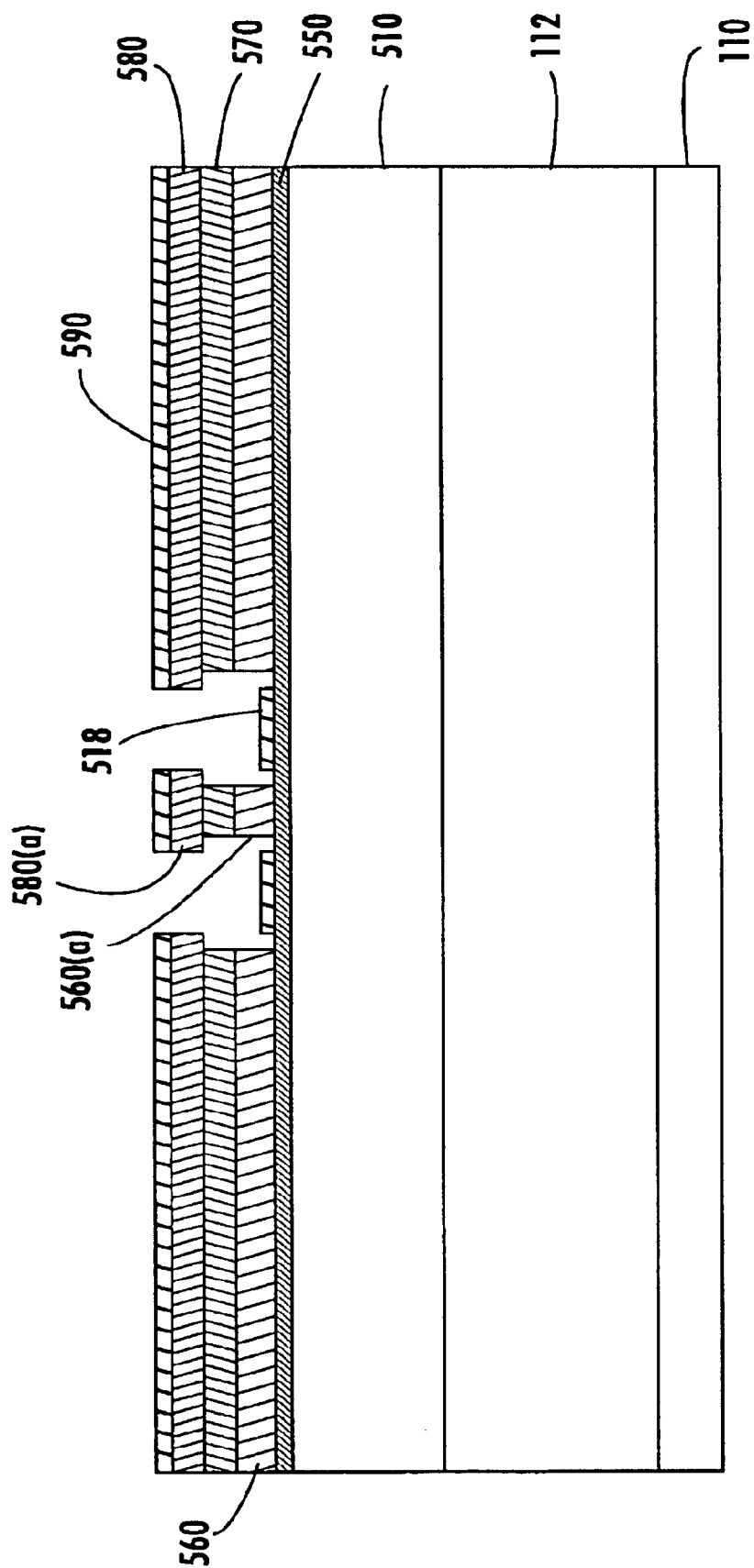
FIG. 17 is a cross-section of the VCSEL of FIG. 16 wherein a second photoresist layer is deposited above a portion of the intracavity contact and first photoresist in accordance with an exemplary embodiment of the present invention.

Referring to FIG. 17, in an exemplary embodiment a second photoresist 740 may be deposited above the aperture formed by the intracavity contact and the first photoresist 710. In the described exemplary embodiment the second photoresist 740 overlaps onto a portion of the first photoresist 710 leaving the outer edge of the annular first photoresist 710 exposed.

Figure 18:
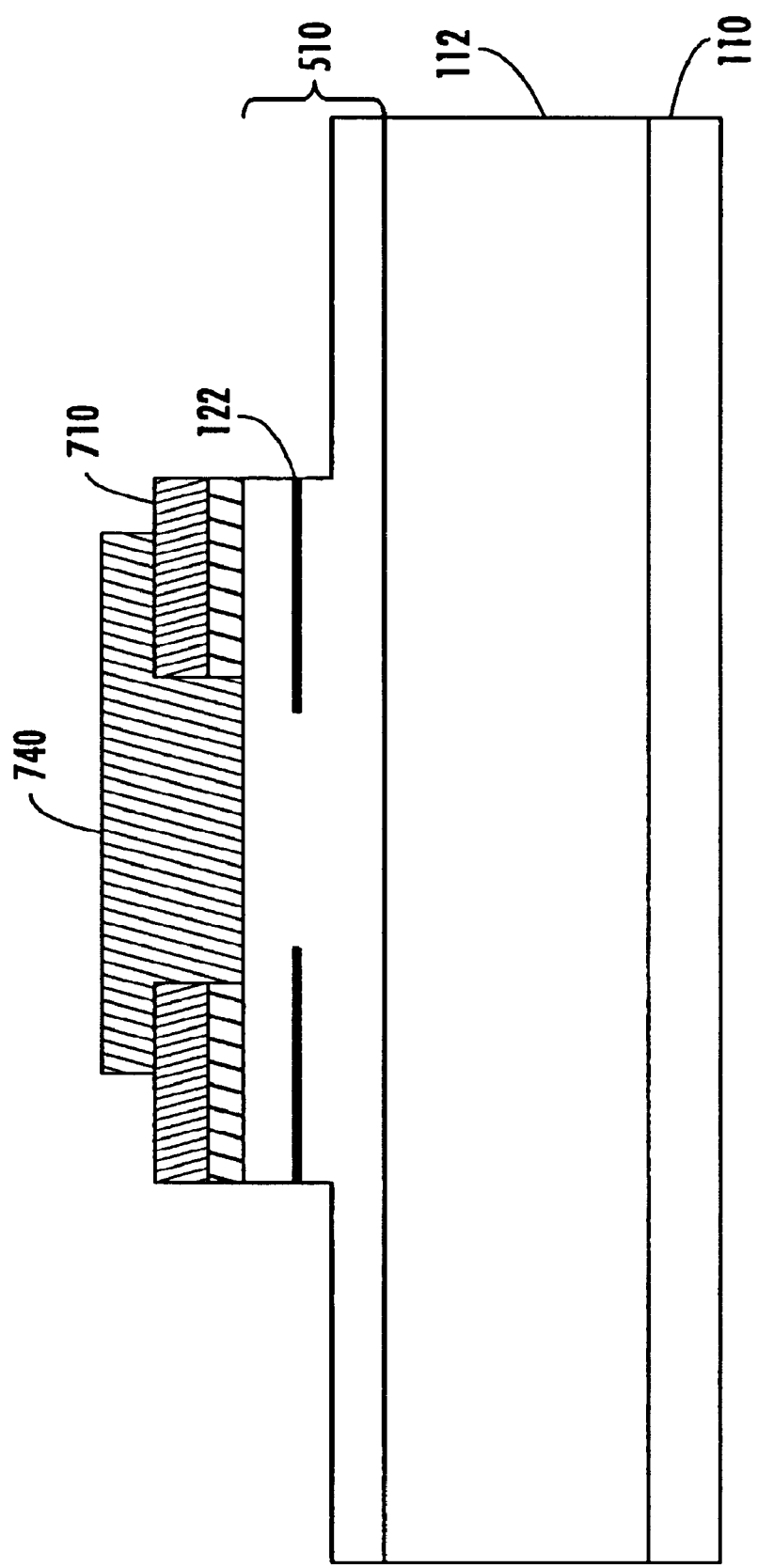
FIG. 18 is a cross section of the VCSEL of FIG. 17 wherein the first photoresist layer is used as an etch mask to define the outer walls of a mesa that exposes an oxide aperture layer in accordance with an exemplary embodiment of the present invention.

Referring to FIG. 18, a portion of the semiconductor layers at least down to the oxide aperture 122 may now be etched using the first photoresist as an etch mask to define the outer wall of the mesa. In an exemplary embodiment a high density plasma etch system, such as, for example an inductively coupled plasma etch or the like may be used to form the mesa to reduce the etch time and minimize erosion of the first photoresist 710.

In the described exemplary embodiment the oxide aperture 122 may again be formed by placing the wafer into a container and heating the wafer to a temperature of about 350 to 500° C. under a controlled environment having a high humidity. In this embodiment the walls of the mesa and the intracavity contact are again defined by the same photoresist, thereby ensuring alignment between the oxide aperture and the intracavity contact. In the described exemplary embodiment an upper mirror 114 again may be formed adjacent the optical cavity 510 and the intra-cavity contact 718.

Figure 19:
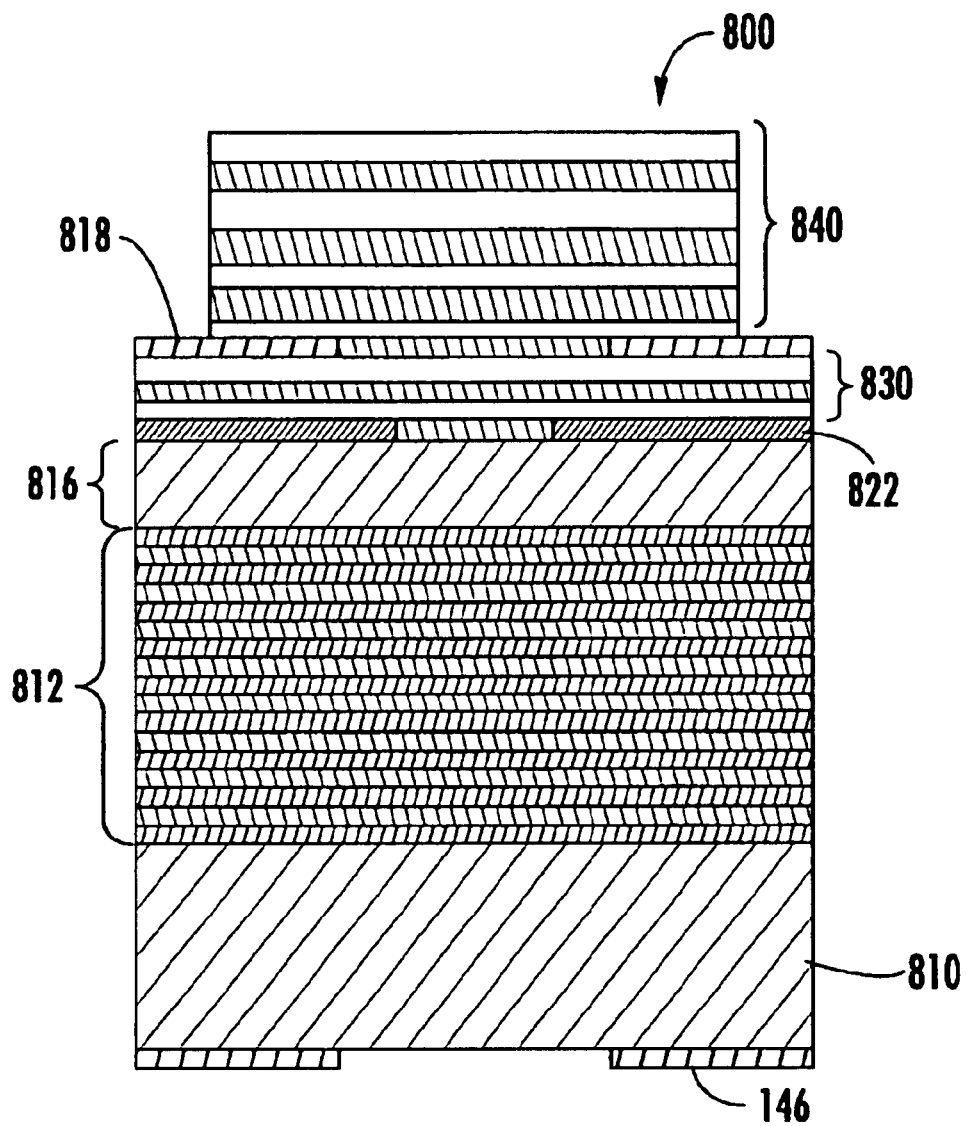
FIG. 19 is a cross-section of a VCSEL having a hybrid upper mirror and an upper ohmic contact that is substantially aligned with an oxide aperture in accordance with an exemplary embodiment of the present invention.

To those skilled in the various arts, the invention itself herein will suggest solutions to other tasks and adaptations for other applications. For example, the present invention is not limited to VCSELs having intracavity contacts and dielectric upper mirrors. For example, referring to FIG. 19, the present invention may be utilized to align an upper ohmic contact 818 formed on a semiconductor portion 830 of a hybrid upper mirror with an oxide aperture 822.

In this embodiment, the number of mirror periods in the semiconductor portion of the hybrid mirror may be restricted to minimize optical loss, resistance etc. associated with conduction through the mirror. A dielectric mirror portion 840 may then be used to provide the reflectance required of the upper hybrid mirror. In this embodiment, the upper ohmic contact 818 may again be self aligned to the oxide aperture 822 to reduce resistance and optical loss.

Turning now to FIGS. 20–26, another exemplary embodiment is illustrated wherein both the n-ohmic contact and the p-ohmic contact are formed within the optical cavity. The completed VCSEL structure is generally indicated at 900 in FIG. 26. In the described exemplary embodiment, the VCSEL 900 may comprise a substrate 910, lower mirror 912 adjacent a substrate 910, an upper mirror 914 above the lower mirror and an active optical layer 916, sandwiched between the upper and lower mirrors.

In the present embodiment, the lower mirror 912 comprises an undoped mirror structure comprising alternating layers as known in the art. Built up on top of the lower mirror is a highly doped n-type contact layer 918. This will form the contact layer for the n-type ohmic contact pad 920. Accordingly, it can be seen that the n-type contact layer 918 is located within the optical cavity between the lower mirror 912 and the active layer 916. Located above and below the active layer 916 are two spacer (cladding) layers 922 and 924. The active layer 916 includes quantum wells are previously described hereinabove.

An oxide aperture layer 926 is formed above the spacer layer 924, and another spacer layer 928 is formed on top of the oxide aperture layer 926.

The p-type ohmic contact layer 930 (p-stack layer) is formed above spacer layer 928, and forms the contact surface for the p-type ohmic contact pad 932. As described hereinabove, the p-stack layer 930 contains one or more doping spikes 934 located at the null points in the standing wave pattern. The doping spikes 934 force electrons to move horizontally in the layer so that they can more easily reach the aperture in a uniform distribution. It is noted that the uppermost layer of the p-stack is preferably a spike layer for better conduction. However, placement of the spike layer at the top of the p-stack 932 forces the device to be out of phase, and thus forces the use of a re-phase layer (puck) illustrated at 936. The re-phase puck 936 put the standing wave back in phase before passing through the upper mirror structure 916. It is once again noted that the relative thicknesses of the respective layers are not to scale and are intended only to illustrate the described features.

Step-by-step construction of the VCSEL 900 is illustrated in FIGS. 20–25 showing build-up and etching of the layers using the self-aligning oxide aperture method described above.

Figure 20:
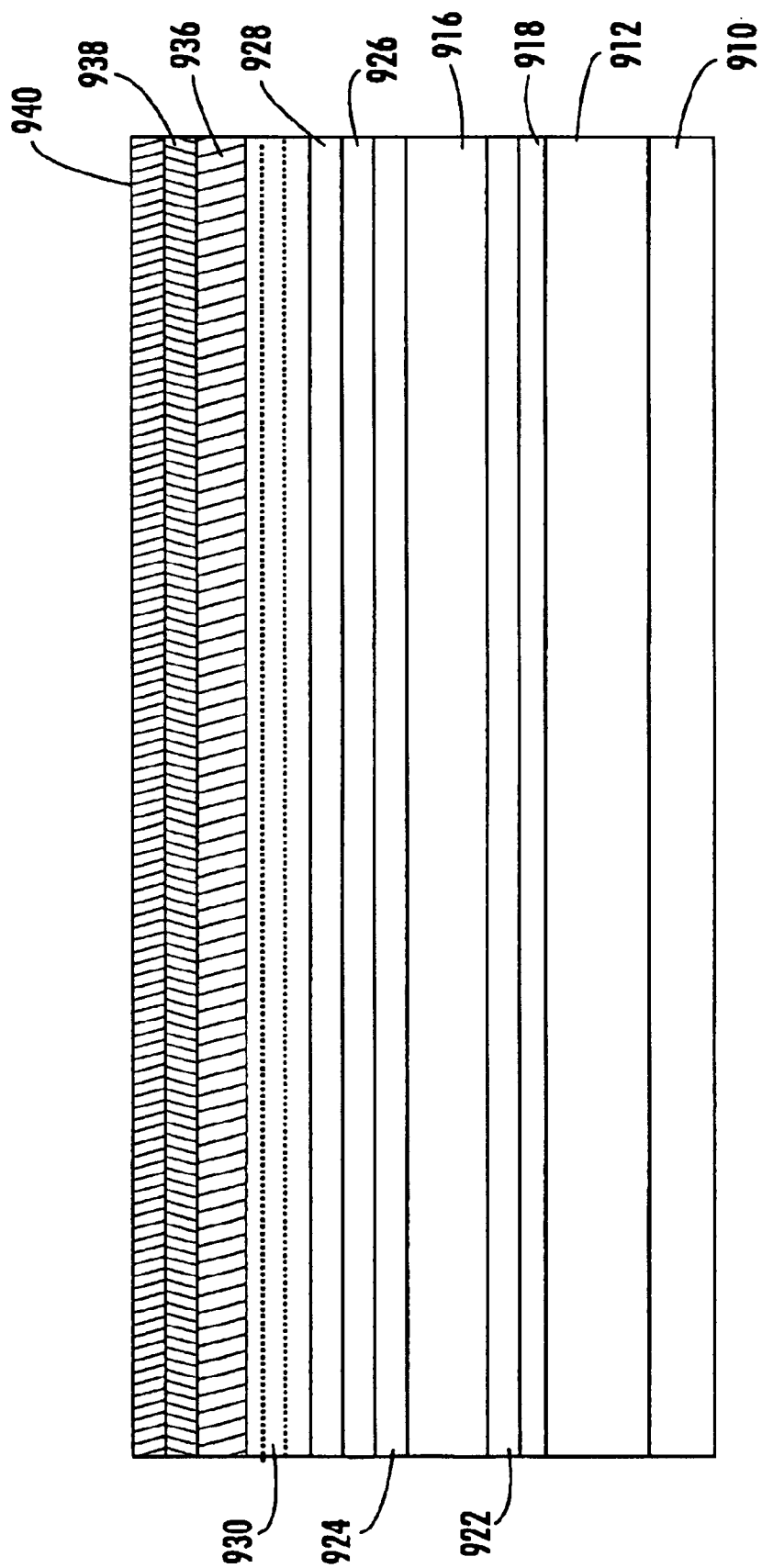
FIGS. 20–26 show the step-by-step formation of a VCSEL having both the n-type and p-type ohmic contacts formed within the optical cavity, and wherein the oxide aperture is self-aligned with the p-type ohmic contact through the formation of the ohmic contact mesa as in the other expemplary embodiments of the invention.

Turning to FIG. 20, a the device is monolithically built up layer by layer up through the re-phase layer 936. A two-part photoresist 938 and 940 is then applied on top of the re-phase layer 936.

Figure 21:
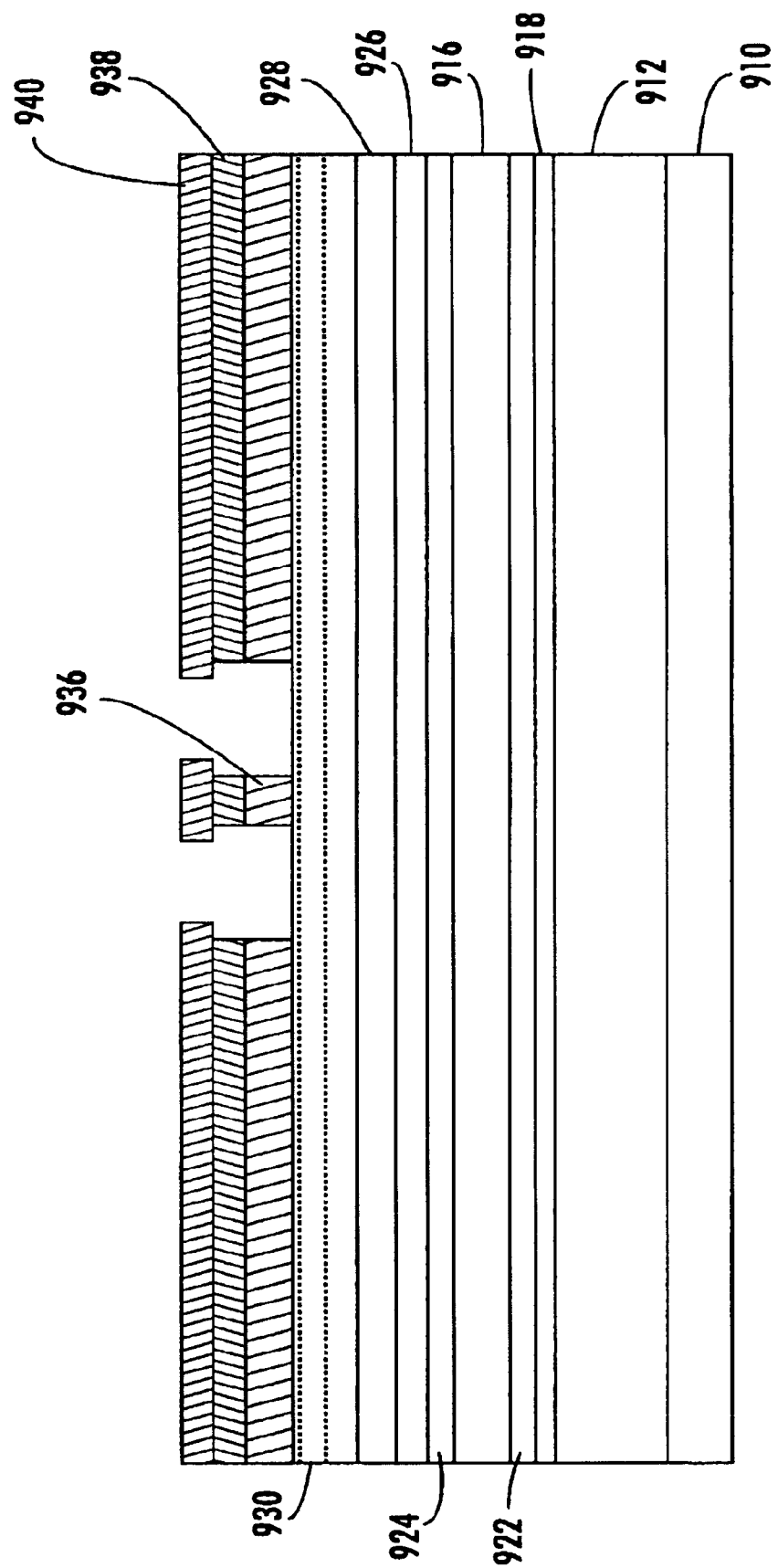
Figure 22:
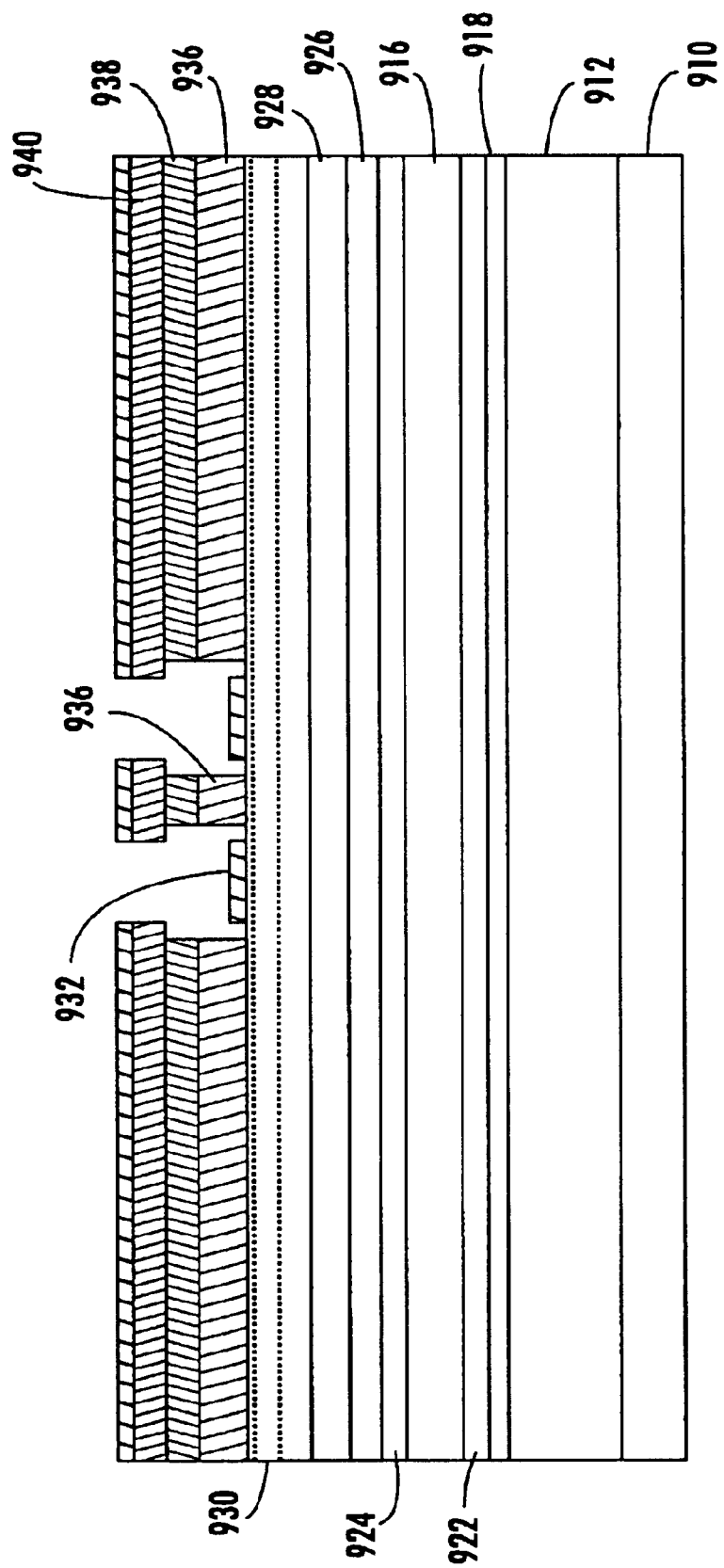

Referring now to FIG. 21, the photoresist 938 and 940 may be patterned and etched prior to the deposition of the intracavity contact metalization 932 (p-type) (see FIG. 22). It is noted that the pattern and etch of the photoresist form the basis for all of the future self-aligned device features. The pattern and etch of the photoresist first forms the central re-phase puck 936 which is located on the optical axis of the device. The intracavity contact pad 932 deposited within the etch channel (FIG. 22) is automatically concentrically self-aligned with the re-phase puck 936 when deposited.

Figure 23:
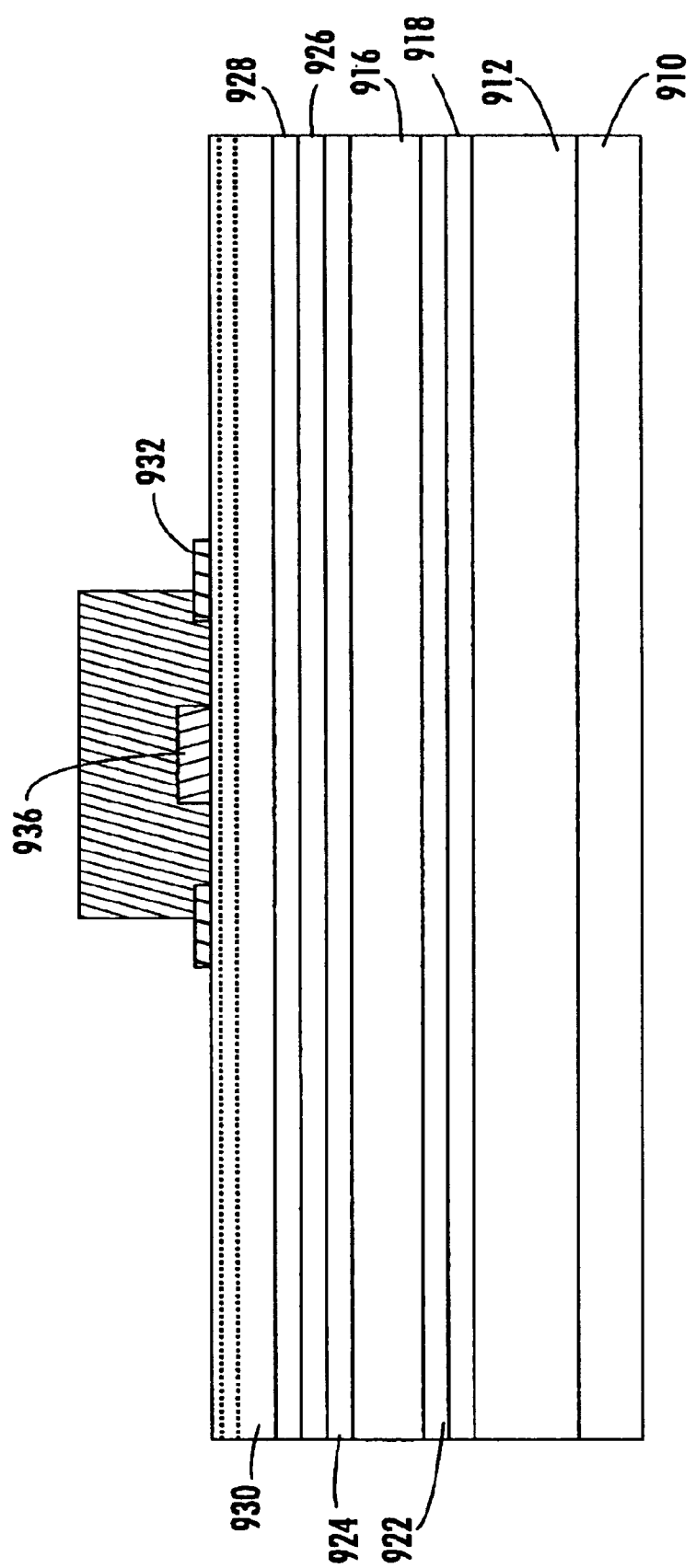

Turning FIG. 23, the photoresist 938 and 940 is removed, leaving the rephase puck 936 and the p-type contact pad 932. A single step photoresist 942 is formed over the rephase puck 936 and contact pad 932 as illustrated in FIG. 23. In the illustrated embodiment, the photoresist 942 overlaps onto a portion of the intracavity contact pad 932 leaving the outer edge of the contact 932 exposed.

Figure 24:
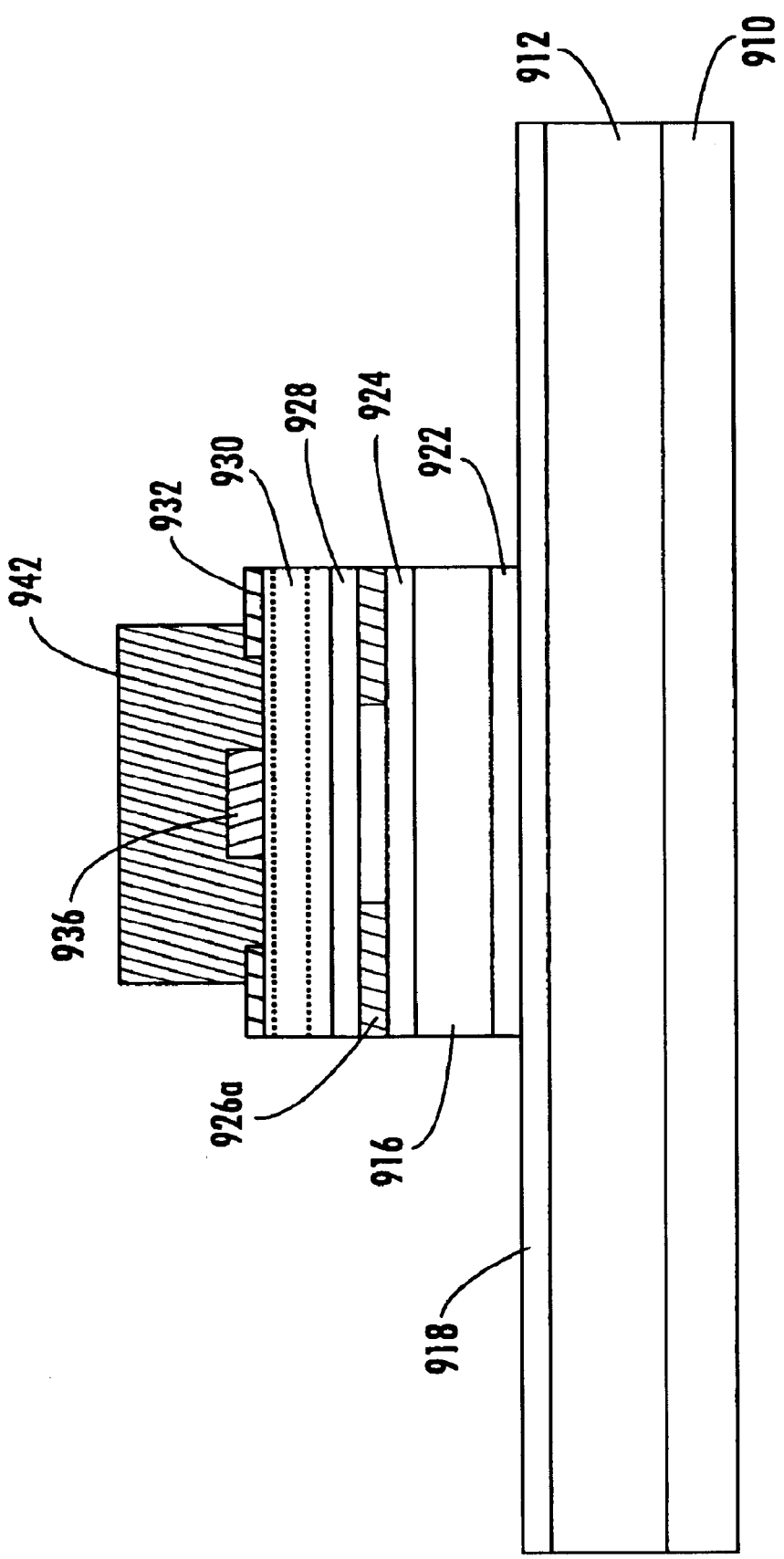
Figure 25:
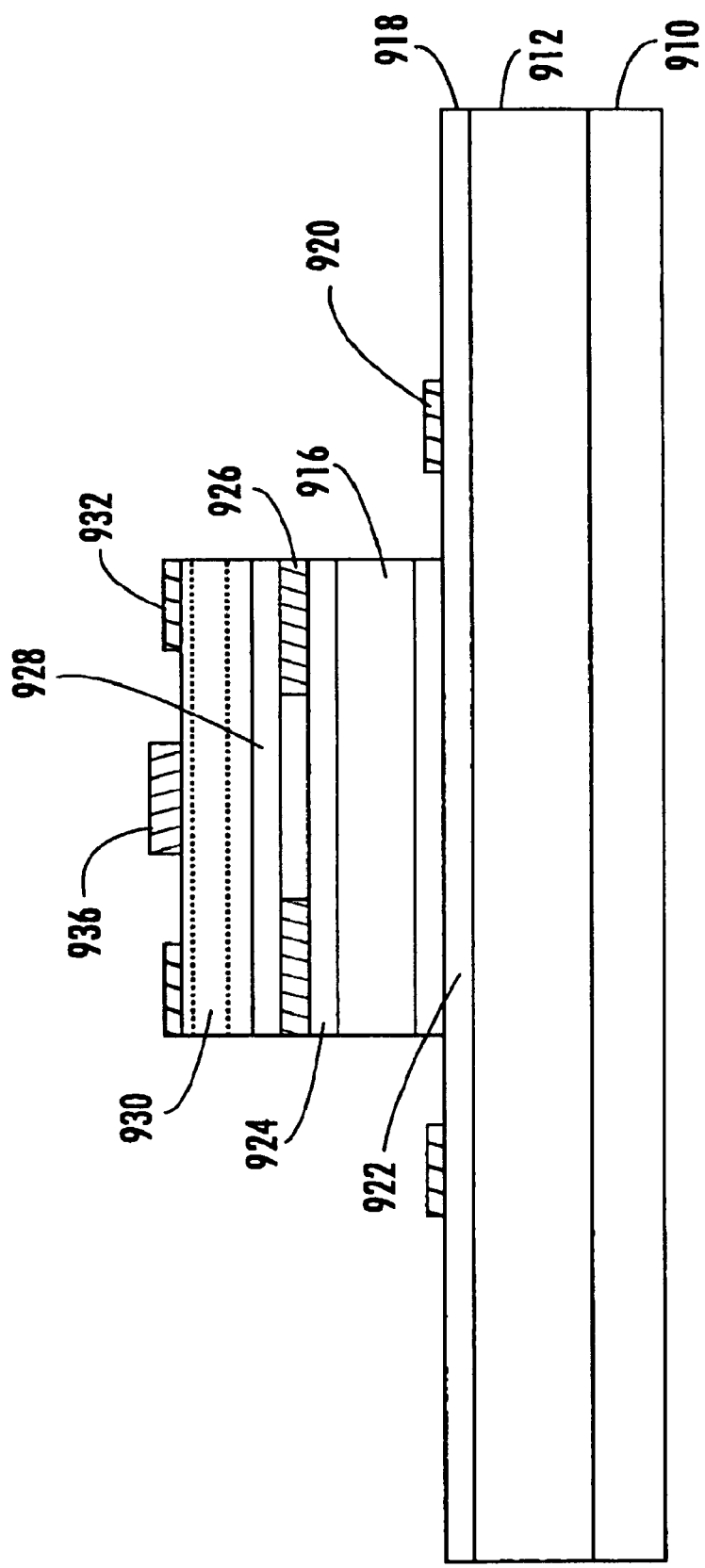

Referring now to FIG. 24, a portion of the semiconductor layers at least down to the n-doped contact later 918 may now be etched using the intracavity contact 932 as an etch mask to define the outer wall of the mesa. Still referring to FIG. 24, the self-aligned oxide aperture 926a may now be formed by placing the wafer into a container and heating the wafer to a temperature of about 350 to 500° C. under a controlled environment having a high humidity. Once again, the oxide aperture 926a self-aligns with the ohmic contact 932 and the rephase puck 936 because of the uniform inward radial oxidation of the oxidation layer 926 as defined by the outside surface of the mesa.

Figure 26:
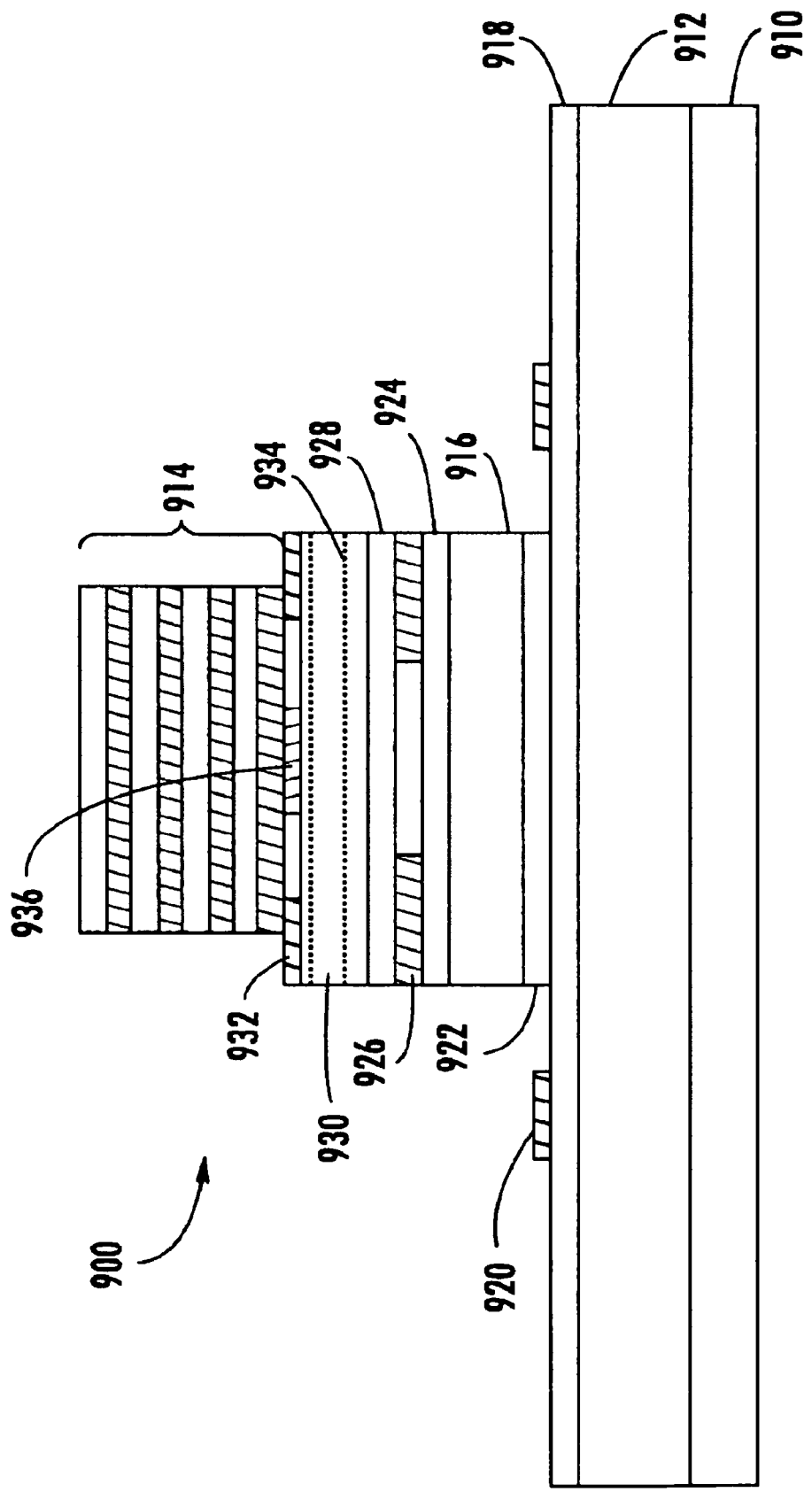

In a final series of steps, the photoresist 942 is removed, the n-type ohmic contact pad 920 is deposited onto the n-type contact layer (FIG. 25), and the upper mirror structure 914 is deposited onto the top of the device (FIG. 26).

It is therefore desired that the present embodiments be considered in all respects as illustrative and not restrictive, reference being made to the appended claims rather than the foregoing description to indicate the scope of the invention.

What is claimed is:

1. A method of forming a VCSEL having a plurality of layers, comprising:

forming a lower mirror on a substrate;

forming an optical cavity over said lower mirror;

forming an oxide aperture layer over said optical cavity;

forming a p-type contact layer over said oxide aperture layer;

forming an annular ohmic intracavity contact pad on said p-type contact layer;

removing a plurality of layers of said VCSEL around said ohmic intracavity contact pad using an outer circumferential edge of said ohmic intracavity contact pad as a mask to form a circular mesa and thereby expose said oxide aperture layer at the mesa sidewall; and oxidizing said oxide aperture layer inwardly from said mesa sidewall to form an annular oxide aperture that is self-aligned with said ohmic intracavity contact pad.

2. The method of claim 1 further comprising the step of forming an upper mirror structure over at least an inner portion of said ohmic intracavity contact pad to form a completed VCSEL structure.

3. A method of forming a VCSEL having a plurality of layers, comprising:

forming a lower mirror on a substrate;

forming an optical cavity over said lower mirror;

forming an oxide aperture layer over said optical cavity;

forming a p-type contact layer over said oxide aperture layer;

forming a dielectric rephase layer over said p-type contact layer;

depositing a photoresist over said dielectric rephase layer;

patterning said photoresist to provide a circular puck of rephase material within said rephase layer and simultaneously define an annular via in said dielectric rephase layer;

forming an annular ohmic intracavity contact pad within said via, said ohmic intracavity contact pad being self-aligned with said puck of rephase material as a result of said patterning step;

removing said photoresist and said rephase layer outside said ohmic intracavity contact pad;

removing a plurality of layers of said VCSEL around said ohmic intracavity contact pad using an outer circumferential edge of said ohmic intracavity contact pad as a mask to form a circular mesa and thereby expose said oxide aperture layer at the mesa sidewall; and oxidizing said oxide aperture layer inwardly from said mesa sidewall to form an annular oxide aperture that is self-aligned with said ohmic intracavity contact pad.

4. The method of claim 1 further comprising the step of forming an upper mirror structure over at least an inner portion of said ohmic intracavity contact pad to form a completed VCSEL structure.

5. A method of forming a VCSEL having a plurality of layers, comprising:

forming a lower mirror on a substrate;

forming an n-type contact layer over said lower mirror;

forming an optical cavity over said lower mirror;

forming an oxide aperture layer over said optical cavity;

forming a p-type contact layer over said oxide aperture layer;

forming an annular ohmic intracavity contact pad on said p-type contact layer;

removing a plurality of layers of said VCSEL around said ohmic intracavity contact pad using an outer circumferential edge of said ohmic intracavity contact pad as a mask to form a circular mesa and to thereby expose said oxide aperture layer at the mesa sidewall, and to thereby further expose an upper surface of said n-type contact layer;

oxidizing said oxide aperture layer inwardly from said mesa sidewall to form an annular oxide aperture that is self-aligned with said ohmic intracavity contact pad; and forming an ohmic intracavity contact pad on said exposed surface of said n-type contact layer.

6. The method of claim 5 further comprising the step of forming an upper mirror structure over at least an inner portion of said ohmic intracavity contact pad to form a completed VCSEL structure.

7. The method of claim 5 wherein said lower mirror is an undoped mirror structure.

8. A method of forming a VCSEL having a plurality of layers, comprising:

forming a lower mirror on a substrate;

forming an n-type contact layer over said lower mirror;

forming an optical cavity over said lower mirror;

forming an oxide aperture layer over said optical cavity;

forming a p-type contact layer over said oxide aperture layer;

forming a dielectric rephase layer over said p-type contact layer;

depositing a photoresist over said dielectric rephase layer;

patterning said photoresist to provide a circular puck of rephase material within said rephase layer and simultaneously define an annular via in said dielectric rephase layer;

forming an annular ohmic intracavity contact pad within said via, said ohmic intracavity contact pad being self-aligned with said puck of rephase material as a result of said patterning step;

removing said photoresist and said rephase layer outside said ohmic intracavity contact pad;

removing a plurality of layers of said VCSEL around said ohmic intracavity contact pad using an outer circumferential edge of said ohmic intracavity contact pad as a mask to form a circular mesa and to thereby expose said oxide aperture layer at the mesa sidewall, and to thereby further expose an upper surface of said n-type contact layer;

oxidizing said oxide aperture layer inwardly from said mesa sidewall to form an annular oxide aperture that is self-aligned with said ohmic intracavity contact pad; and forming an ohmic intracavity contact pad on said exposed surface of said n-type contact layer.

9. The method of claim 8 further comprising the step of forming an upper mirror structure over at least an inner portion of said ohmic intracavity contact pad to form a completed VCSEL structure.

10. The method of claim 8 wherein said lower mirror is an undoped mirror structure.

* * * * *